US012575147B2

(12) United States Patent
Baek et al.

(10) Patent No.: US 12,575,147 B2
(45) Date of Patent: Mar. 10, 2026

(54) 3D-STACKED TRANSISTOR STRUCTURE WITH BARRIER LAYER BETWEEN UPPER GATE STRUCTURE AND LOWER GATE STRUCTURE

(71) Applicant: SAMSUNG ELECTRONICS CO., LTD., Suwon-si (KR)

(72) Inventors: Jaejik Baek, Watervliet, NY (US); Seungchan Yun, Waterford, NY (US); Kang-ill Seo, Springfield, VA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 370 days.

(21) Appl. No.: 18/195,150

(22) Filed: May 9, 2023

(65) Prior Publication Data

US 2024/0243172 A1 Jul. 18, 2024

Related U.S. Application Data

(60) Provisional application No. 63/439,740, filed on Jan. 18, 2023.

(51) Int. Cl.
H10D 62/10 (2025.01)
H01L 25/07 (2006.01)
(Continued)

(52) U.S. Cl.
CPC ......... H10D 62/121 (2025.01); H01L 25/074 (2013.01); H10D 30/014 (2025.01);
(Continued)

(58) Field of Classification Search
CPC .... H10D 62/121; H10D 30/014; H10D 84/85; H10D 30/6557; H10D 88/00; H10D 84/0167; H10D 30/6735; H10D 30/43
See application file for complete search history.

(56) References Cited

U.S. PATENT DOCUMENTS 8,440,559 B2 5/2013 Lenski et al.
9,287,273 B2 3/2016 Ragnarsson et al.
(Continued)

FOREIGN PATENT DOCUMENTS

CN 113506801 A 10/2021
CN 113644068 A 11/2021
(Continued)

OTHER PUBLICATIONS

Communication issued on Jun. 5, 2024 by the European Patent Office for European Patent Application No. 23217582.8.

*Primary Examiner* — Christine A Enad
(74) *Attorney, Agent, or Firm* — Myers Bigel, P.A.

(57) ABSTRACT

Provided is a three-dimensionally-stacked field-effect transistor (3DSFET) device including a plurality of 3DSFETs on a single substrate, wherein each of the 3DSFET includes: a $1^{st}$ channel structure surrounded by a $1^{st}$ gate structure; and a $2^{nd}$ channel structure surrounded by a $2^{nd}$ gate structure, the $2^{nd}$ channel structure provided on the $1^{st}$ channel structure, and wherein, in at least one of the 3DSFETs, the $1^{st}$ gate structure is isolated from the $2^{nd}$ gate structure through a barrier layer including a dielectric material comprising tantalum.

20 Claims, 13 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 84/01* | (2025.01) |
| *H10D 84/03* | (2025.01) |
| *H10D 84/85* | (2025.01) |
| *H10D 88/00* | (2025.01) |

(52) U.S. Cl.
CPC ......... *H10D 30/43* (2025.01); *H10D 30/6735* (2025.01); *H10D 30/6757* (2025.01); *H10D 84/0167* (2025.01); *H10D 84/038* (2025.01); *H10D 84/85* (2025.01); *H10D 88/00* (2025.01)

(56) References Cited

U.S. PATENT DOCUMENTS

| | | | | | |
|---|---|---|---|---|---|
| 11,227,769 | B2 | | 1/2022 | Tang et al. | |
| 11,233,119 | B2 | | 1/2022 | Peng et al. | |
| 11,532,708 | B2 | * | 12/2022 | Liebmann | .......... H10D 30/0245 |
| 2022/0181441 | A1 | * | 6/2022 | Liebmann | ............ H10D 84/038 |
| 2022/0278217 | A1 | | 9/2022 | Li | |
| 2022/0375935 | A1 | * | 11/2022 | Yim | ................... H10D 84/0181 |
| 2023/0170352 | A1 | * | 6/2023 | Bao | ...................... H10D 84/856 |
| | | | | | 257/351 |

FOREIGN PATENT DOCUMENTS

| | | | |
|---|---|---|---|
| CN | 113936999 A | 1/2022 |
| CN | 115116957 A | 9/2022 |
| TW | 201347183 A | 11/2013 |
| TW | 202135172 A | 9/2021 |

* cited by examiner

FIG. 3

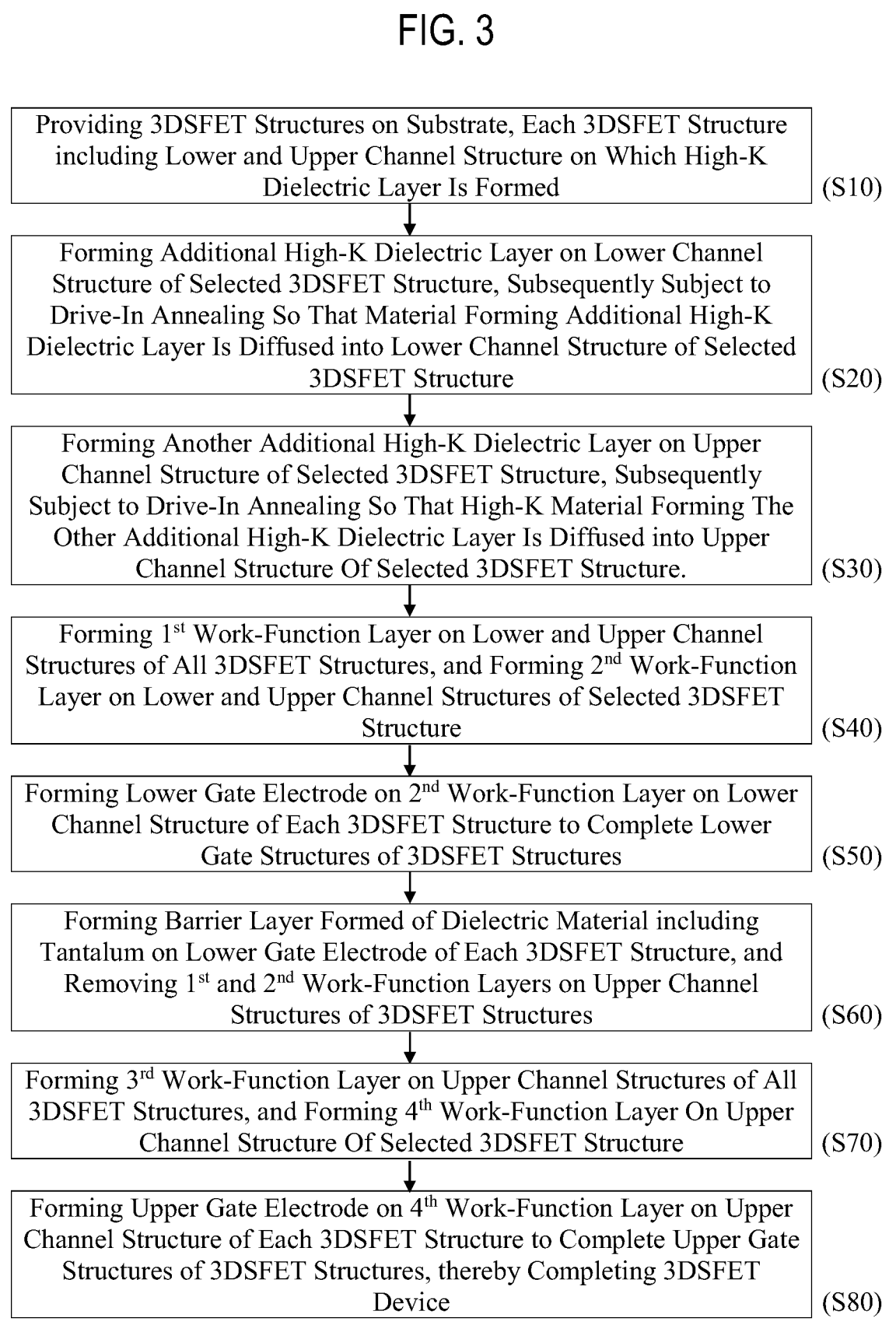

| | |
|---|---|
| Providing 3DSFET Structures on Substrate, Each 3DSFET Structure including Lower and Upper Channel Structure on Which High-K Dielectric Layer Is Formed | (S10) |
| Forming Additional High-K Dielectric Layer on Lower Channel Structure of Selected 3DSFET Structure, Subsequently Subject to Drive-In Annealing So That Material Forming Additional High-K Dielectric Layer Is Diffused into Lower Channel Structure of Selected 3DSFET Structure | (S20) |
| Forming Another Additional High-K Dielectric Layer on Upper Channel Structure of Selected 3DSFET Structure, Subsequently Subject to Drive-In Annealing So That High-K Material Forming The Other Additional High-K Dielectric Layer Is Diffused into Upper Channel Structure Of Selected 3DSFET Structure. | (S30) |
| Forming $1^{st}$ Work-Function Layer on Lower and Upper Channel Structures of All 3DSFET Structures, and Forming $2^{nd}$ Work-Function Layer on Lower and Upper Channel Structures of Selected 3DSFET Structure | (S40) |
| Forming Lower Gate Electrode on $2^{nd}$ Work-Function Layer on Lower Channel Structure of Each 3DSFET Structure to Complete Lower Gate Structures of 3DSFET Structures | (S50) |
| Forming Barrier Layer Formed of Dielectric Material including Tantalum on Lower Gate Electrode of Each 3DSFET Structure, and Removing $1^{st}$ and $2^{nd}$ Work-Function Layers on Upper Channel Structures of 3DSFET Structures | (S60) |
| Forming $3^{rd}$ Work-Function Layer on Upper Channel Structures of All 3DSFET Structures, and Forming $4^{th}$ Work-Function Layer On Upper Channel Structure Of Selected 3DSFET Structure | (S70) |
| Forming Upper Gate Electrode on $4^{th}$ Work-Function Layer on Upper Channel Structure of Each 3DSFET Structure to Complete Upper Gate Structures of 3DSFET Structures, thereby Completing 3DSFET Device | (S80) |

3D-STACKED TRANSISTOR STRUCTURE WITH BARRIER LAYER BETWEEN UPPER GATE STRUCTURE AND LOWER GATE STRUCTURE

CROSS-REFERENCE TO RELATED APPLICATION

This application is based on and claims priority to U.S. Provisional Application No. 63/439,740 filed on Jan. 18, 2023 in the U.S. Patent and Trademark Office, the disclosure of which is incorporated herein in its entirety by reference.

BACKGROUND

1. Field

Apparatuses and methods consistent with example embodiments of the disclosure relate to a three-dimensionally-stacked field-effect transistor (3DSFET) device in which a lower gate structure and an upper gate structure are isolated from each other by a barrier layer having a smaller deposition thickness.

2. Description of Related Art

A 3DSFET device formed of a lower field-effect transistor (FET) and an upper FET stacked thereon has been introduced to respond to fast-growing demand for an integrated circuit having a high device density and performance. Each of the lower and upper FETs may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, or as a multi-bridge channel field-effect transistor (MBCFET).

However, the high device density required for the 3DSFET device exposes various challenges including difficulties in isolating a lower gate structure for a lower FET and an upper gate structure for an upper FET from each other as they may have different gate threshold voltages.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

According to an embodiment, there is provided a three-dimensionally-stacked field-effect transistor (3DSFET) device including a plurality of 3DSFETs on a single substrate, wherein each of the 3DSFET may include: a $1^{st}$ channel structure surrounded by a $1^{st}$ gate structure; and a $2^{nd}$ channel structure surrounded by a $2^{nd}$ gate structure, the $2^{nd}$ channel structure provided on the $1^{st}$ channel structure, and wherein, in at least one of the 3DSFETs, the $1^{st}$ gate structure is isolated from the $2^{nd}$ gate structure through a barrier layer including a dielectric material comprising tantalum. The dielectric material may include tantalum nitride.

According to an embodiment, each of the $1^{st}$ gate structure and the $2^{nd}$ gate structure may include a high-k dielectric layer, a work-function layer, and a gate electrode, and, in at least one of the 3DSFETs, at least one of the $1^{st}$ channel structure and the $2^{nd}$ channel structure may include a high-k dielectric material diffused therein. The diffused high-k dielectric material may be different from a material forming the high-k dielectric layer.

According to an embodiment, in at least one of the 3DSFETs, at least one of the $1^{st}$ gate structure and the $2^{nd}$ gate structure may include another work-function layer on the work-function layer.

According to an embodiment, the work-function layer of at least one of the $1^{st}$ gate structure and the $2^{nd}$ gate structure of at least one of the 3DSFET structures may be thicker than the work-function layer of at least one of the $1^{st}$ gate structure and the $2^{nd}$ gate structure of another at least one of the 3DSFET structures.

According to an embodiment, there is provided a 3DSFET device including a plurality of 3DSFETs on a single substrate, wherein each of the 3DSFET may include: a $1^{st}$ channel structure surrounded by a $1^{st}$ gate structure; and a $2^{nd}$ channel structure surrounded by a $2^{nd}$ gate structure, the $2^{nd}$ channel structure provided on the $1^{st}$ channel structure, wherein each of the $1^{st}$ gate structure and the $2^{nd}$ gate structure includes a high-k dielectric layer, a work-function layer, and a gate electrode, and wherein, in at least one of the 3DSFETs, the $1^{st}$ gate structure is isolated from the $2^{nd}$ gate structure through a barrier layer including a dielectric material having etch selectivity against a material included in the work-function layer of $1^{st}$ gate structure. The dielectric material may include tantalum nitride, and the material included in the work-function layer of the $1^{st}$ gate structure may include titanium According to embodiments, wherein, in at least one of the 3DSFETs, at least one of the $1^{st}$ channel structure and the $2^{nd}$ channel structure may include a high-k dielectric material diffused therein, and the diffused high-k dielectric material may be different from a material forming the high-k dielectric layer. The work-function layer of at least one of the $1^{st}$ gate structure and the $2^{nd}$ gate structure of at least one of the 3DSFET structures may be thicker than the work-function layer of at least one of the $1^{st}$ gate structure and the $2^{nd}$ gate structure of another at least one of the 3DSFET structures.

According to an embodiment, there is provided a method of manufacturing a three-dimensionally-stacked field-effect transistor (3DSFET) device. The method may include: providing at least one 3DSFET structure including a lower channel structure and an upper channel structure on a substrate; forming a lower gate structure on the lower channel structure; forming a barrier layer including formed of a dielectric material including tantalum on the lower gate structure; and forming an upper gate structure on the upper channel structure.

According to embodiments, the at least one 3DSFET may include a plurality of 3DSFET structures, each including the lower channel structure surrounded by a high-k dielectric layer and the upper channel structure surrounded by the high-k dielectric layer, and the method may further include: forming a $1^{st}$ additional high-k dielectric layer on the lower channel structure of a $1^{st}$ selected 3DSFET among the 3DSFET structures, and annealing the lower channel structure of the $1^{st}$ selected 3DSFET such that a material of the $1^{st}$ additional high-k dielectric layer is diffused into the lower channel structure of the $1^{st}$ selected 3DSFET; and forming a $2^{nd}$ additional high-k dielectric layer on the upper channel structure of a $2^{nd}$ selected 3DSFET among the 3DSFET structures, and annealing the upper channel structure of the $2^{nd}$ selected 3DSFET such that a material of the $2^{nd}$ additional high-k dielectric layer is diffused into the upper channel structure of the $2^{nd}$ selected 3DSFET.

According to an embodiment, the forming the lower gate structure may include: forming a $1^{st}$ work-function layer on lower channel structures and upper channel structures of the 3DSFET structures, and forming a $2^{nd}$ work-function layer on a lower channel structure of a $1^{st}$ selected 3DSFET; and forming a lower gate electrode on the $2^{nd}$ work-function layer on the lower channel structure of each of the 3DSFET structures. Further, the forming the upper gate structure may include: removing the $1^{st}$ work-function layer and the $2^{nd}$ work-function layers on the upper channel structures of the 3DSFET structures; and forming a $3^{rd}$ work-function layer on the upper channel structures of the 3DSFET structures, and forming a $4^{th}$ work-function layer on an upper channel structure of a $2^{nd}$ selected 3DSFET.

BRIEF DESCRIPTION OF DRAWINGS

Example embodiments of the disclosure will be more clearly understood from the following detailed description taken in conjunction with the accompanying drawings.

FIG. 3 illustrate a flowchart of a method of forming the 3DSFET device shown in FIGS. 1A and 1B, according to an embodiment.

DETAILED DESCRIPTION OF EMBODIMENTS

Figure 1A:
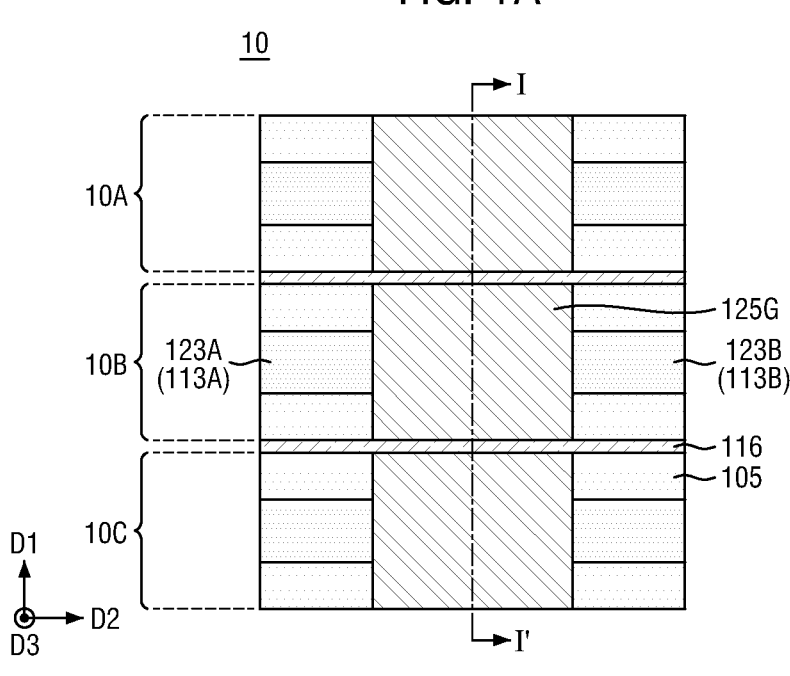
FIG. 1A illustrates a top plan view of a 3DSFET device in which three 3DSFETs having different gate threshold voltages are formed on a substrate, and a lower gate structure and an upper gate structure of each 3DSFET is isolated from each other by a barrier layer including tantalum nitride, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, nanosheet sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, one or more source/drain regions, contact structures, isolation structures of a field-effect transistor or a semiconductor device including the same and materials forming these structures may be omitted herein when these structures are not related to the novel features of the embodiments.

Figure 1B:
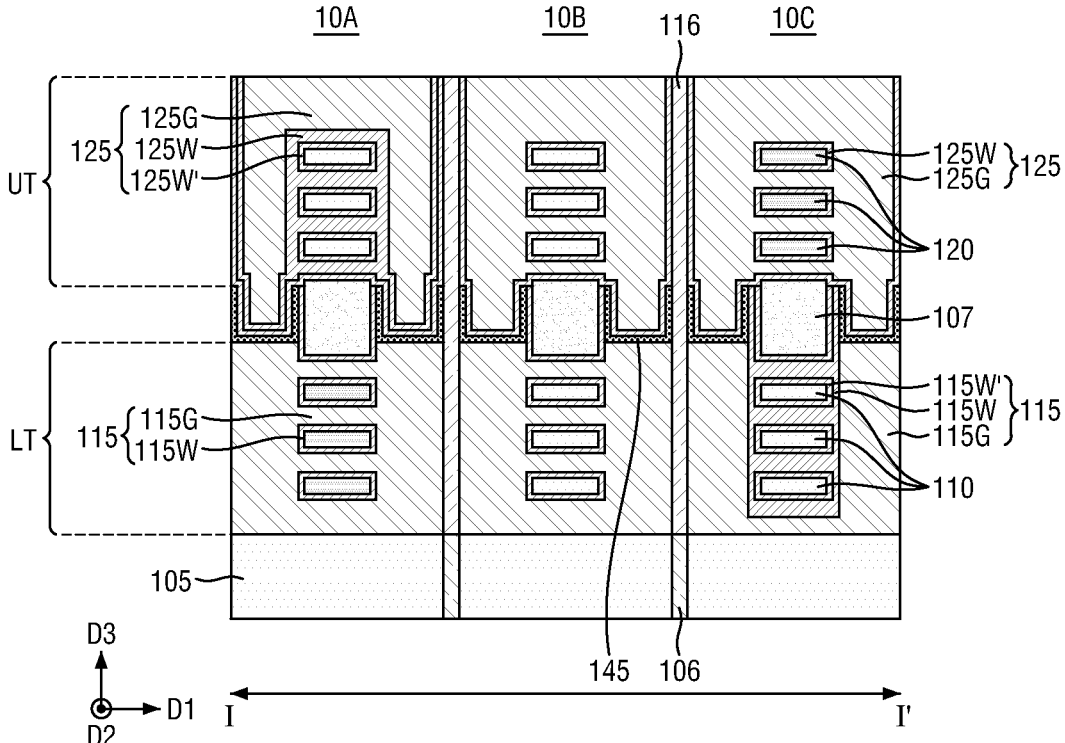
FIG. 1B illustrates a cross-section view of the 3DSFET device of FIG. 1A taken along a line I-I' shown in FIG. 1A, according to an embodiment.

FIG. 1A illustrates a top plan view of a 3DSFET device in which three 3DSFETs having different gate threshold voltages are formed on a substrate, and a lower gate structure and an upper gate structure of each 3DSFET is isolated from each other by a barrier layer including tantalum nitride, according to an embodiment. FIG. 1B illustrates a cross-section view of the 3DSFET device of FIG. 1A taken along a line I-I' shown in FIG. 1A, according to an embodiment.

Referring to FIGS. 1A and 1i, a 3DSFET device 10 according to an embodiment may include a 1st 3DSFET 10A, a $2^{nd}$ 3DSFET 10B and a $3^{rd}$ 3DSFET 10C arranged in a D1 direction, which is a channel-width direction, on a substrate 105. The three 3DSFETs 10A, 10B and 10C may be isolated from each other through a gate-cut structure 116. The gate-cut structure 116 may be formed above a shallow trench isolation (STI) structure formed in the substrate 105.

Each of the $1^{st}$ to $3^{rd}$ 3DSFETs 10A, 10B and 10C may be formed of a lower FET LT, which may be a p-type metal-oxide-semiconductor FET (PMOS), and an upper FET UT, which may be an n-type metal-oxide-semiconductor FET (NMOS). However, the disclosure is not limited thereto, and any one of the lower FETs LT and the upper FETs UT may be the PMOS or the NMOS.

The substrate 105 may be a single bulk substrate of a semiconductor material, for example, silicon (Si), or a silicon-on-insulator (SOI) substrate, not being limited thereto. The STI structure 106 may be formed of a dielectric oxide material such as silicon oxide (e.g., SiO, $SiO_2$, etc.), silicon oxynitride (e.g., SiON) or their combination, not being limited thereto. The gate-cut structure 116 may be formed of a material similar to that of the STI structure 106.

Each of the $1^{st}$ to $3^{rd}$ 3DSFETs 10A, 10B and 10C may include a plurality of lower channel layers 110 at a lower stack and a plurality of upper channel layers 120 at an upper stack. The channel layers 110 and 120 may each be formed of a material such as silicon (Si), germanium (Ge), silicon germanium (SiGe), and/or a silicon-containing material, not being limited thereto.

The lower channel layers 110 may be surrounded by a lower gate structure 115, and the upper channel layers 120 may be surrounded by an upper gate structure 125. The lower gate structure 115 may include at least a lower work-function layer 115W and a lower gate electrode 115G formed on the lower work-function layer 115W. The upper gate structure 125 may include at least an upper work-function layer 125W and an upper gate electrode 125G formed on the upper work-function layer 125W. The lower work-function layer 115W and the upper work-function layer 125W may each be formed of titanium (Ti), aluminum (Al), tantalum (Ta), palladium (Pa), platinum (Pt) or their compound, not being limited thereto. The lower work-function layer 115W and the upper work-function layer 125W may be formed of the same material or different materials. For example, when the lower work-function layer 115W and the upper work-function layer 125W are formed respectively to constitute an NMOS and a PMOS, the lower work-function layer 115W may include titanium (Ti) or aluminum (Al), and the upper work-function layer 125W may include palladium (Pa) or platinum (Pt). As another example, even when the lower work-function layer 115W and the upper work-function layer 125W are formed respectively to constitute an NMOS and a PMOS, the lower work-function layer 115W and the upper work-function layer 125W may both be formed of titanium (Ti). The lower gate electrode 115G and the upper gate electrode 125G may each be formed of tungsten (W), aluminum (Al), copper (Cu) or cobalt (Co), not being limited thereto.

According to an embodiment, the lower gate structure 115 of the $3^{rd}$ 3DSFET 10C, among the $1^{st}$ to $3^{rd}$ 3DSFETs 10A, 10B and 10C, may include an inner lower work-function layer 115W' (also referred to as $1^{st}$ work-function layer 115W') between the lower work-function layer 115W (also referred to as $2^{nd}$ work-function layer 115W) and each of the lower channel layers 110. Thus, the $3^{rd}$ 3DSFET 10C may have a thicker lower work-function layer than the $1^{st}$ and $2^{nd}$ 3DSFETs 10A and 10B by a width of the inner lower work-function layer 115W'. The inner lower work-function layer 115W' may have the same as or similar thickness as the lower work-function layer 115W. Thus, while each of the $1^{st}$ and $2^{nd}$ 3DSFETs 10A and 10B has a lower work-function layer of about 2 nm, the $3^{rd}$ 3DSFET 10C may have a lower work-function layer of about 4 nm. Because of the thicker lower work-function layer, a gate threshold voltage (e.g., 0.5 V to 1.5 V) of the lower gate structure 115 of the $3^{rd}$ 3DSFET 10C may be lower than a gate threshold voltage (e.g., 1.5 V to 3.0 V) of the lower gate structure 115 of the other two 3DSFETs 10A and 10B. The inner lower work-function layer 115W' may be formed of the same material forming the lower work-function layer 115W. Thus, the $3^{rd}$ 3DSFET 10C may have a thicker lower work-function layer for its lower gate structure 125 than the other 3DSFETs 10A and 10B.

In contrast, according to an embodiment, the upper gate structure 125 of the $1^{st}$ 3DSFET 10A, among the $1^{st}$ to $3^{rd}$ 3DSFETs 10A, 10B and 10C, may include an inner upper work-function layer 125W' (also referred to as $3^{rd}$ work-function layer 125W') between the upper work-function layer 125W (also referred to as $4^{th}$ work-function layer 125W) and each of the upper channel layers 120. Thus, the $1^{st}$ 3DSFET 10A may have a thicker upper work-function layer than the $2^{nd}$ and $3^{rd}$ 3DSFETs 10B and 10C by a width of the inner upper work-function layer 125W'. The inner upper work-function layer 125W' may have the same as or similar thickness as the upper work-function layer 125W. Thus, while each of the $2^{nd}$ and $3^{rd}$ 3DSFETs 10B and 10C has an upper work-function layer of about 2 nm, the $1^{st}$ 3DSFET 10A may have an upper work-function layer of about 4 nm. Because of the thicker upper work-function layer, a gate threshold voltage (e.g., 0.5 V to 1.5 V) of the upper gate structure 125 of the $1^{st}$ 3DSFET 10A may be lower than a gate threshold voltage (e.g., 1.5 V to 3.0 V) of the upper gate structure 115 of the other two 3DSFETs 10B and 10C. The inner upper work-function layer 125W' may be formed of the same material forming the upper work-function layer 125W.

Each of the lower gate structure 115 and the upper gate structure 125 may also include a gate dielectric layer (not shown) formed between the work-function layer 115W or 125W (or the inner work-function layer 115W' or 125W') and the corresponding channel layer. The gate dielectric layer may include an interfacial layer and a high-k dielectric layer. The high-k dielectric layer may include a material such as hafnium oxide (e.g., HfO) that provides the gate structures 115 and 125 with higher capacitance and improved gate control, and the interfacial layer may include a material such as silicon oxide (e.g., $SiO_2$) that improves adhesion and stability of the high-k dielectric layer on the channel layers 110 and 120.

According to an embodiment, an additional high-k dielectric material such as aluminum oxide (e.g., AlO, $Al_2O_3$, etc.) or lanthanum oxide (e.g., LaO, $La_2O_3$, etc.) may be further included in at least a portion of the lower channel layers 110 of the $1^{st}$ 3DSFET 10A and the upper channel layers 120 of the $3^{rd}$ 3DSFET 10C. The aluminum oxide may have a dielectric constant ranging 8 to 12, and the lanthanum oxide may have a dielectric constant ranging 20 to 30, for example. As will be described later, this additional high-k dielectric material may have been diffused into these selected channel layers through a drive-in annealing operation performed in a process of manufacturing the 3DSFET device 10.

As the additional high-k dielectric material is included in the selected channel layers of the 3DSFET device 10, the corresponding FETs, that is, the lower gate structure 115 of the $1^{st}$ 3DSFET 10A and the upper gate structure 125 of the $3^{rd}$ 3DSFET 10C may have a reduced gate threshold voltage.

The lower channel layers 110 and the lower gate structure 115 along with lower source/drain regions 113A and 113B may form the lower FET LT of each of the 3DSFETs 10A, 10B and 10C. The lower channel layers 110 may form a lower channel structure for current flow controlled by the lower gate structure 115 of the lower FET LT. Similarly, the upper channel layers 120 and the upper gate structure 125 along with upper source/drain regions 123A and 123B may form the upper FET UT of each of the 3DSFETs 10A, 10B and 10C. The upper channel layers 120 may form an upper channel structure for current flow controlled by the upper gate structure 125 of the upper FET UT. In FIG. 1A, the lower source/drain regions 113A and 113B are overlapped by the upper source/drain regions 123A and 123B in a D3 direction.

The lower channel layers 110 may be isolated from the upper channel layers 120 by a channel isolation layer 107 which may be formed of, for example, silicon nitride (e.g., SiN), not being limited thereto.

The lower gate structure 115 may be isolated from the upper gate structure 125 by a barrier layer 145 which has prevented the lower gate electrode 115G, which may be formed thereunder from an etchant used to remove the lower work-function layer 115W formed on the upper channel layers 120 in the process of manufacturing the 3DSFET device 10 to be described later in reference to FIGS. 4A to 4R.

According to an embodiment, the barrier layer 145 may be formed of a dielectric material including tantalum), not being limited thereto, which has a higher material density and a smaller deposition thickness while a corresponding barrier layer of a related-art 3DSFET device may be formed of a material such as amorphous silicon (a-Si) having a lower material density and a greater deposition thickness. For example the barrier layer 145 may include tantalum nitride (e.g., TaN) or tantalum carbide (e.g., TaC). Due to the smaller deposition thickness (e.g., about 1 nm), tantalum nitride may be thinly formed thorough, for example, atomic layer deposition (ALD) on a top surface of the lower gate electrode 115W and side surfaces of the channel isolation layer 107 and the gate-cut structure 116 to form the barrier layer 145 having a U-shape or a similar shape at a side of the channel isolation layer 107, as shown in FIG. 1B. The dielectric material forming the barrier layer 145 may be different from the material forming the upper work-function layer 125W. For example, the dielectric material such as tantalum nitride has etch selectivity against titanium that may be included in the lower work-function layer 115W.

In contrast, when the barrier layer 145 is formed of amorphous silicon, the amorphous silicon may not be thinly deposited on the top surface of the lower gate electrode 115G and the side surfaces of the channel layer 107 and the gate-cut structure 116 because of its greater deposition thickness (e.g., about 4 nm) when the amorphous silicon is deposited through atomic layer deposition. Thus, the barrier layer 145 including the amorphous silicon may form a seam structure having a void therein, and the etchant used to remove the lower work-function layer 115W formed on the upper channel layers 120 may have flown through the void to attack or etch the lower gate electrode 115G in the process of manufacturing the 3DSFET device 10, thereby adversely affecting the performance of the lower gate structure 115 of each of the 3DSFETs 10A, 10B and 10C.

Figure 2:
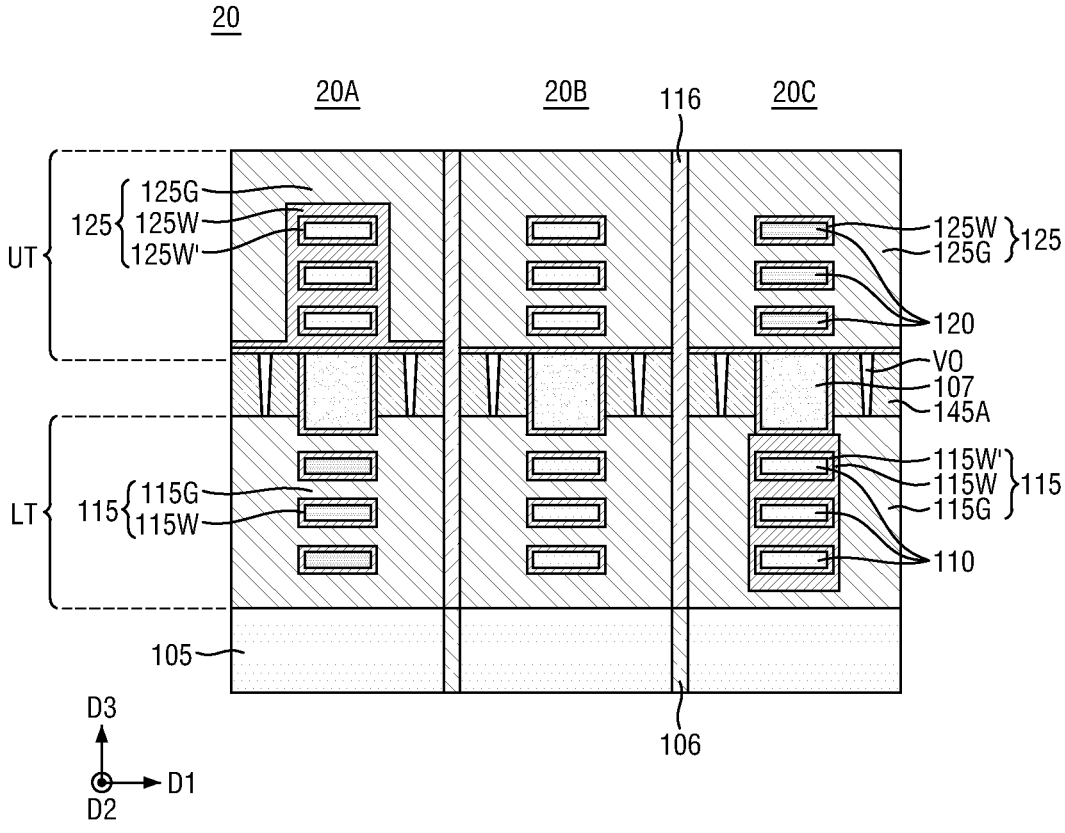
FIG. 2 illustrates a related-art 3DSFET device in which 3DSFETs having different gate threshold voltages are formed on a substrate, and a lower gate structure and an upper gate structure of each 3DSFET is isolated from each other by a barrier layer including amorphous silicon.

FIG. 2 illustrates a related-art 3DSFET device in which 3DSFETs having different gate threshold voltages are formed on a substrate, and a lower gate structure and an upper gate structure of each 3DSFET is isolated from each other by a barrier layer including amorphous silicon.

Referring to FIG. 2, a related-art 3DSFET device 20 has the same device structure as that of the 3DSFET device 10 shown in FIGS. 1A and 1B, except that a void VO is formed in a barrier layer 145A isolating the lower gate structure 115 from the upper gate structure 125.

As described above, the barrier layer 145A of the related-art 3DSFET device 20 may include a material such as amorphous silicon which has a lower material density and a greater deposition thickness compared to the barrier layer 145 of the 3DSFET device 10 of the present embodiment. Thus, the barrier layer 145A may take a form of a seam structure that includes the void VO through which the etchant used to remove the lower work-function layer 115W formed on the upper channel layers 120 may have flown to attack or etch the lower gate electrode 115G in the process of manufacturing the related-art 3DSFET device 20. Further, the barrier layer 145A including amorphous silicon may occupy a larger area on the lower gate electrode 115G, which may generate a greater gate resistance compared to the thin barrier layer 145 including tantalum nitride.

However, tantalum nitride of the barrier layer 145 of the 3DSFET device 10 may be able to be thinly deposited without forming a seam structure including the void VO in the barrier layer 145A of the related-art 3DSFET device 20, the barrier layer 145 may protect the lower gate electrode 115G more effectively from the etchant used to remove the lower work-function layer 115W formed on the upper channel layers 120 in the process of manufacturing the 3DSFET device 10 as will be described later.

In addition, the barrier layer 145 including tantalum nitride may allow for a larger area for forming the upper gate electrode 125G thereon such that the U-shaped barrier layer 145 may encompass or enclose a portion of the upper gate electrode 125G. Due to this structure of the barrier layer 145, a bottom surface of the upper gate electrode 125G may be at a level below a top surface of the channel isolation layer. Thus, there may be a reduced gate resistance in the barrier layer 145 of the 3DSFET device 10 compared to the barrier layer 145A of the related-art 3DSFET device 20.

Accordingly, the 3DSFET device 10 shown in FIGS. 1A and 1B may provide more effective gate structure isolation between the lower FET structure LT' and the upper FET structure UT' through the barrier layer 145 including tantalum nitride while the 3DSFETs 10A, 10B and 10C included therein have different gate threshold voltages at both the lower stack and the upper stack.

Although the barrier layer 145 includes tantalum nitride in the above embodiment, the disclosure is not limited thereto. According to an embodiment, a different material or compound including tantalum such as tantalum carbide may also be used as the barrier layer 145. For example, tantalum carbide has a material density of around 14.7 g/cm³, which is similar to that of tantalum nitride which is around 13.3 g/cm³. Tantalum carbide is also known as having similar material characteristics such as thermal stability and conductivity.

According to the embodiment described above in reference to FIG. 1B, the lower channel layers 110 of only one of the $1^{st}$ to $3^{rd}$ 3DSFETs 10A, 10B and 10C (e.g., the $1^{st}$ 3DSFET 10A) includes the additional high-k dielectric material diffused therein, and the upper channel layers 120 of a different only one of the $1^{st}$ to $3^{rd}$ 3DSFETs 10A, 10B and 10C (e.g., the $3^{rd}$ 3DSFET 10C) includes the additional high-k dielectric material diffused therein. However, the disclosure is not limited thereto. According to an embodiment, all of the lower channel layers 110 and the upper channel layers 120 of at least one of the $1^{st}$ to $3^{rd}$ 3DSFETs 10A, 10B and 10C may include the additional high-k dielectric material diffused therein.

According to the embodiment described above in reference to FIG. 1B, the lower gate structure 115 of only one of the $1^{st}$ to $3^{rd}$ 3DSFETs 10A, 10B and 10C (e.g., the $3^{rd}$ 3DSFET 10C) includes the inner lower work-function layer 115W', and the upper gate structure 125 of a different only one of the $1^{st}$ to $3^{rd}$ 3DSFETs 10A, 10B and 10C (e.g., the $1^{st}$ 3DSFET 10A) includes the inner upper work-function layer 125W'. However, the disclosure is not limited thereto. According to an embodiment, both of the lower gate structure 115 and the upper gate structure 125 of at least one of the $1^{st}$ to $3^{rd}$ 3DSFETs 10A, 10B and 10C may include the inner lower work-function layer 115W' and the inner upper work-function layer 125W'.

In the meantime, FIG. 1B shows that each of the lower FETs LT and the upper FETs UT has three channel layers as the corresponding channel structure. However, the disclosure is not limited thereto, and each of the lower FETs LT and the upper FETs UT may have more or less than three channel layers. FIG. 1B also shows that each of the lower FETs LT and the upper FETs UT is implemented by a nanosheet transistor including nanosheet channel layers as its channel structure. However, the disclosure is not limited thereto, and each of the lower FETs LT and the upper FETs UT may be implemented by a different type of transistor such as a FinFET including vertical fin structures as its channel structure, for example.

FIG. 3 illustrate a flowchart of a method of forming the 3DSFET device shown in FIGS. 1A and 1i, according to an embodiment. FIGS. 4A to 4R illustrate intermediate 3DSFET devices after respective steps of the method described in reference to FIG. 3 are performed, according to embodiments.

Figure 4A:
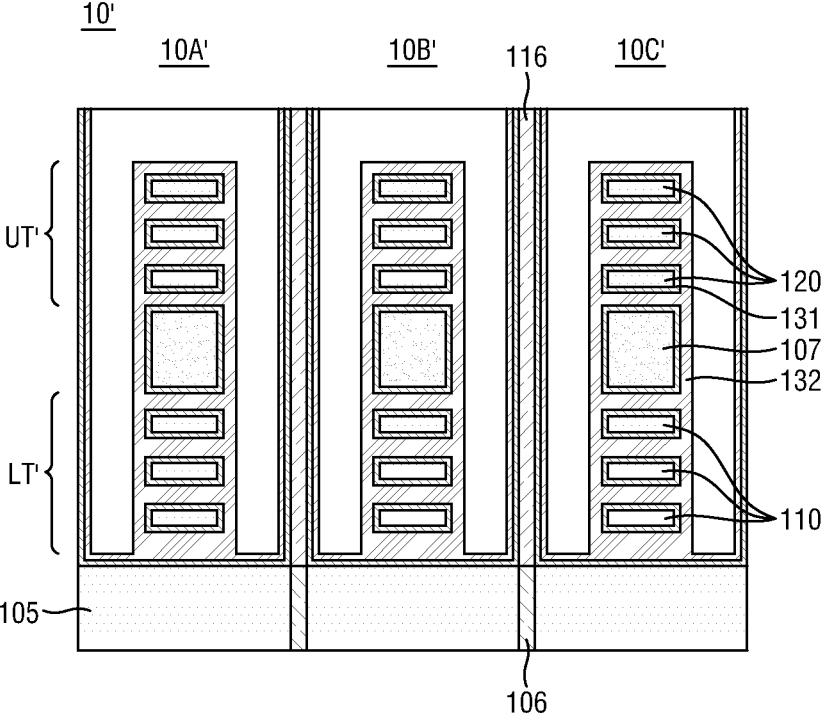
FIGS. 4A to 4R illustrate intermediate 3DSFET devices after respective steps of the method described in reference to FIG. 3 are performed, according to embodiments.
Figure 4B:
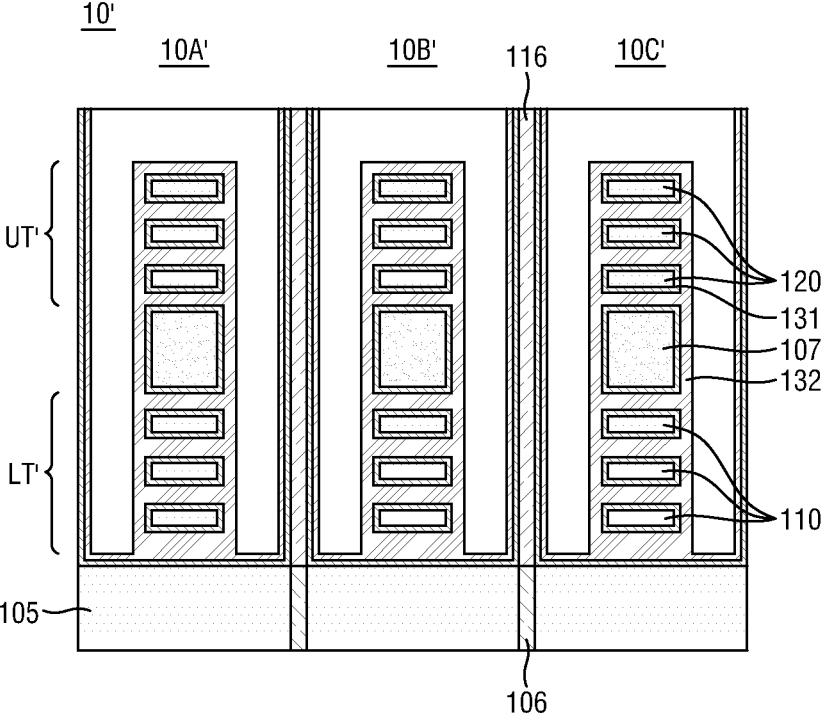
Figures 4C, 4D:
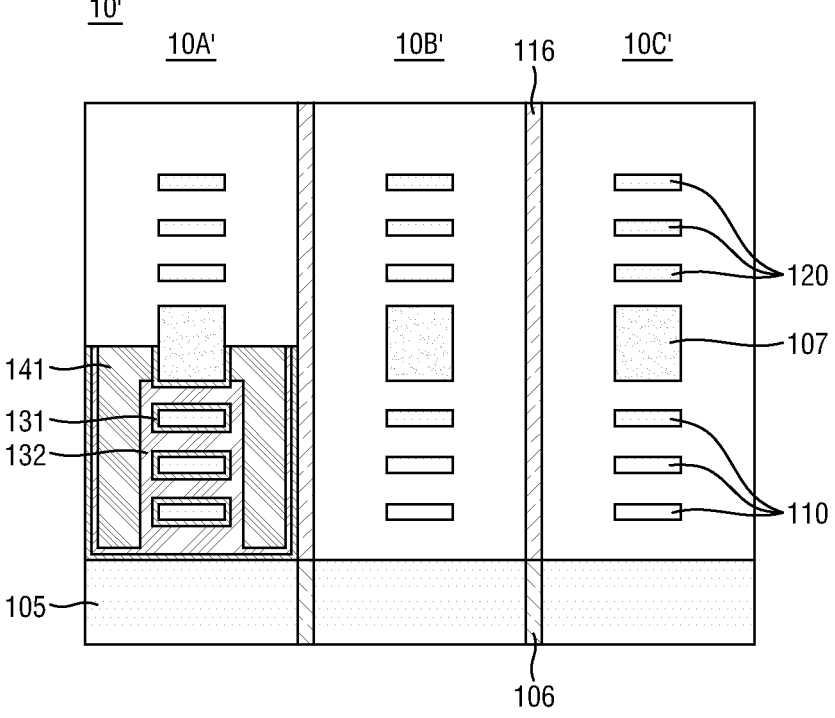
Figures 4E, 4F:
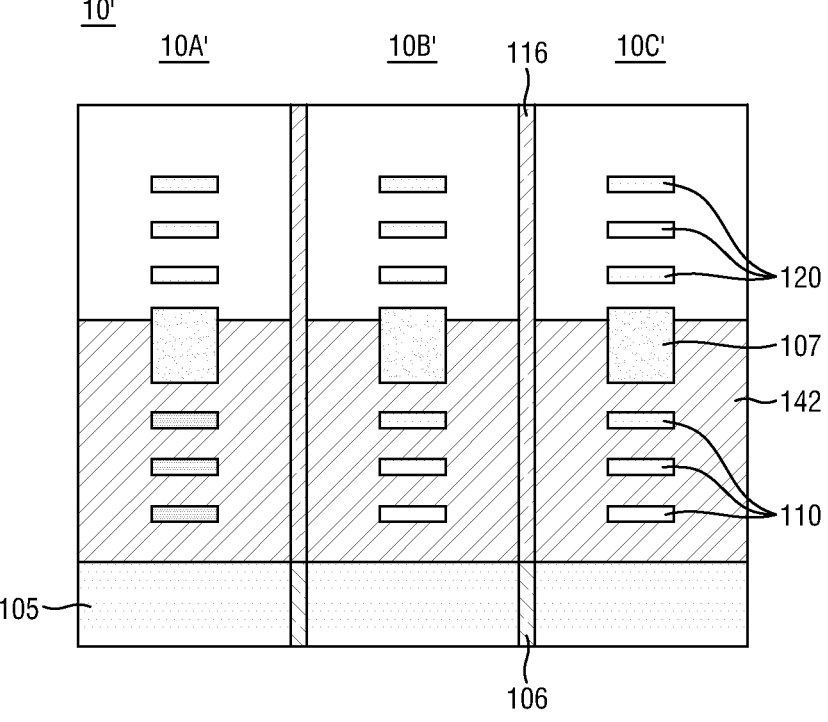
Figures 4G, 4H:
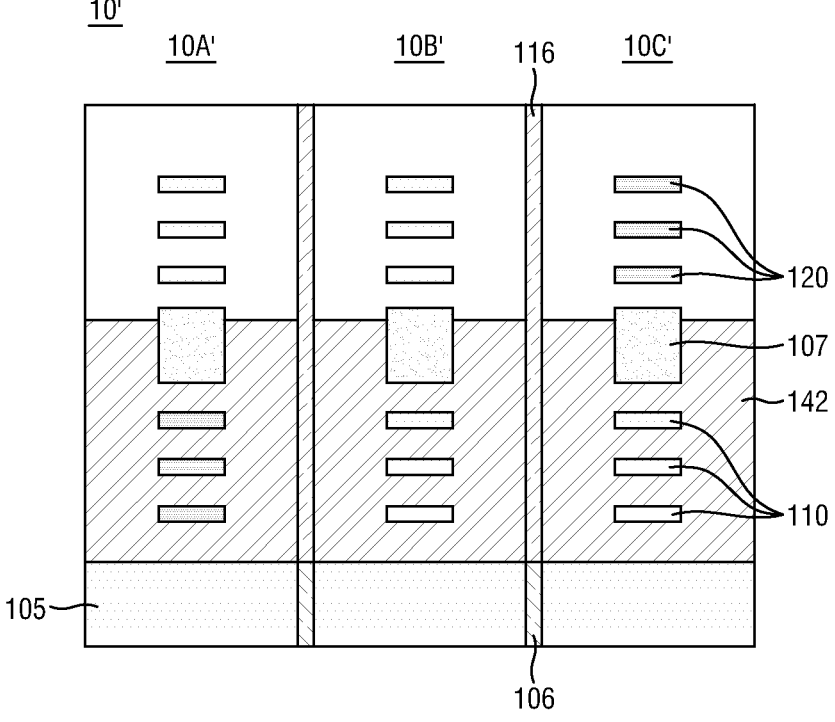
Figure 4I:
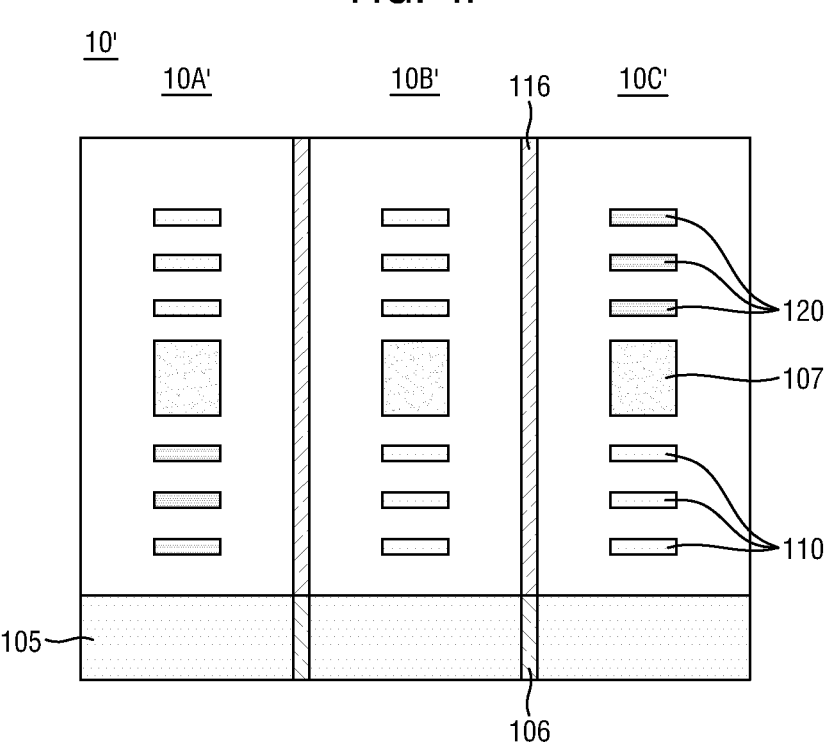
Figure 4J:
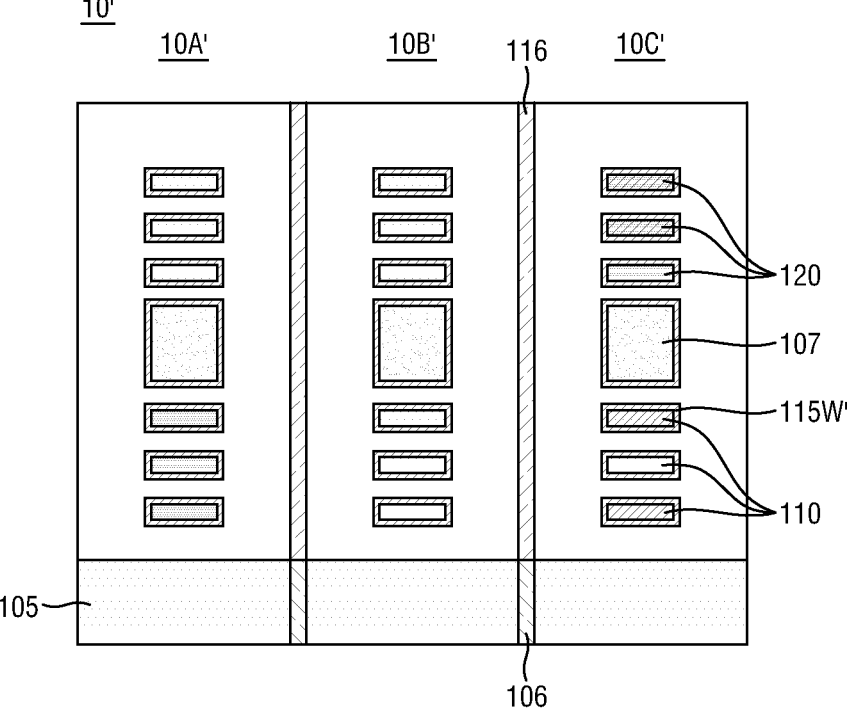
Figure 4K:
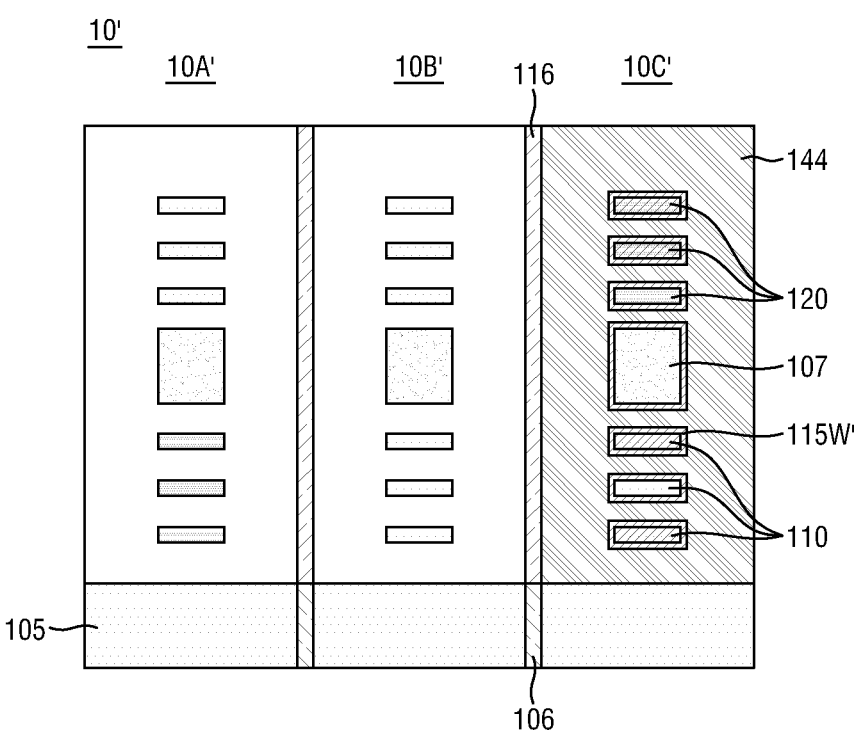
Figure 4L:
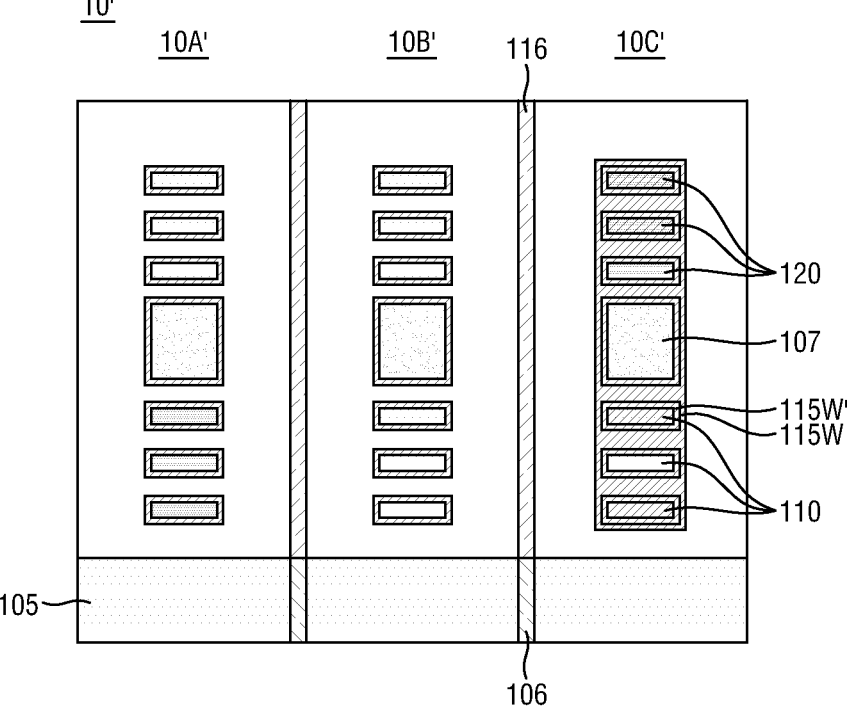
Figures 4M, 4N:
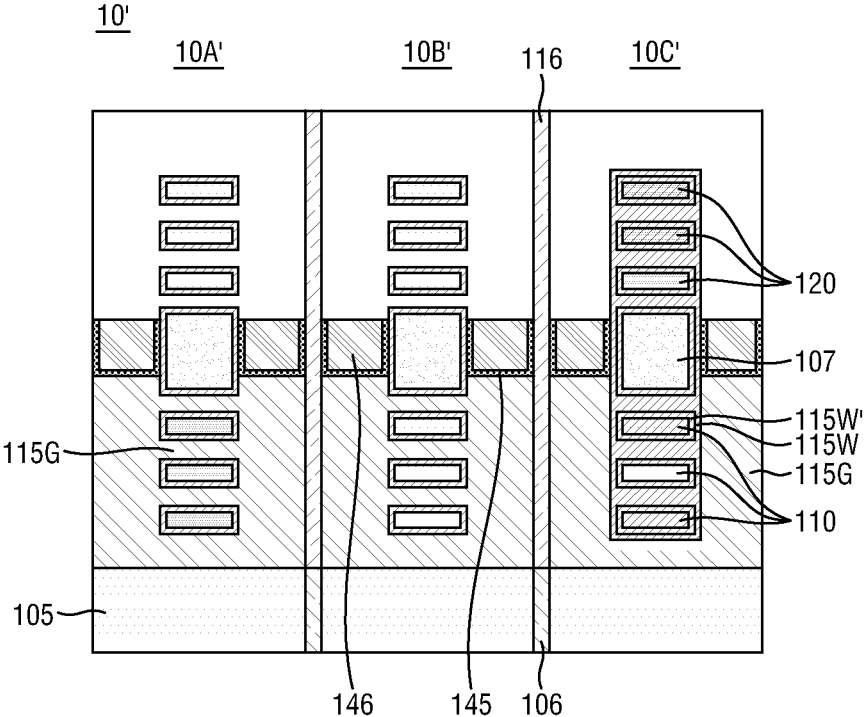
Figure 4O:
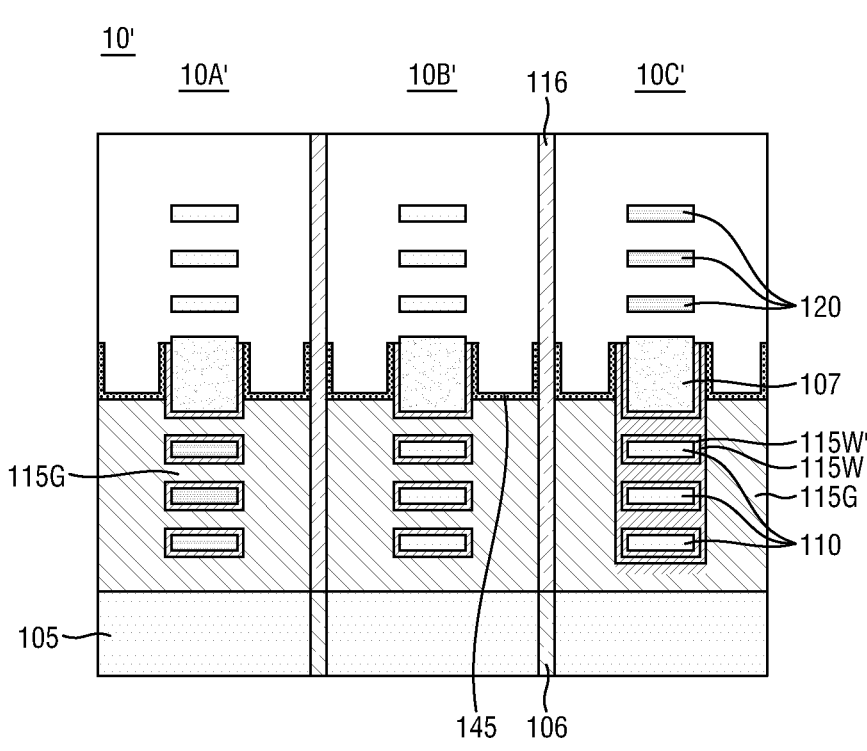
Figure 4P:
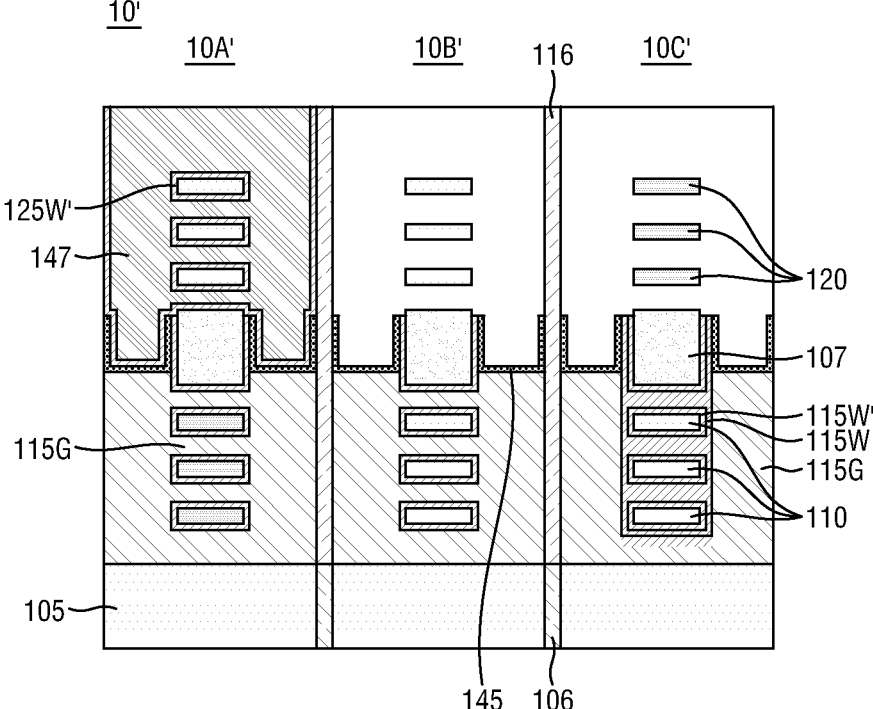
Figures 4Q, 4R:
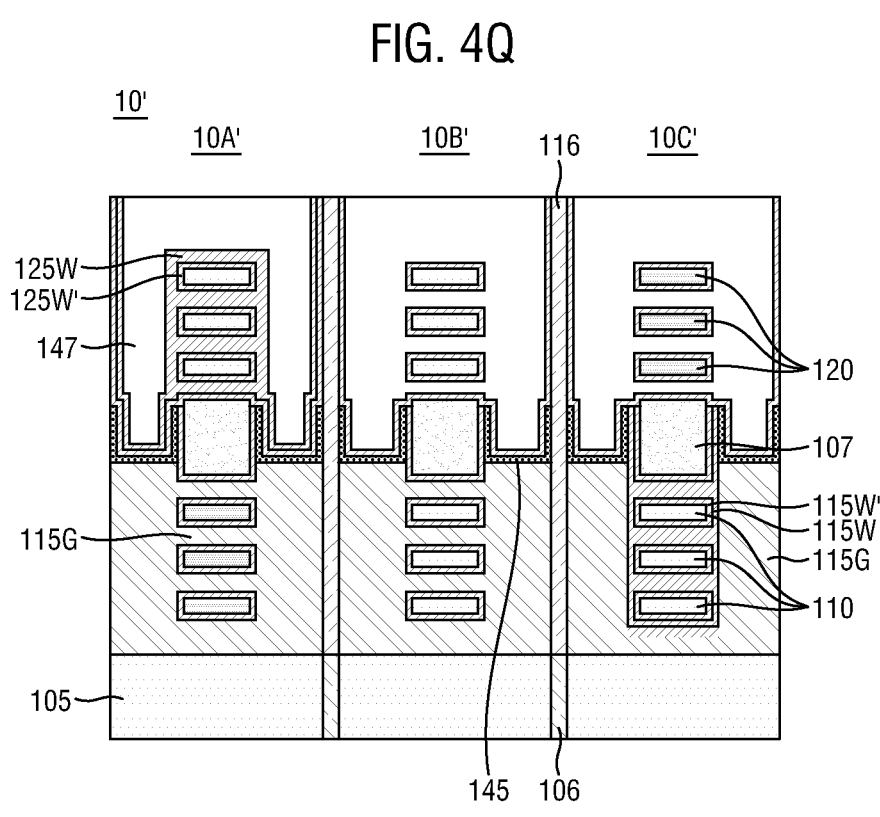

Herebelow, an example method of forming the 3DSFET device 10 is described in reference to FIG. 3 and FIGS. 4A to 4R which correspond to FIGS. 1A and 1B. Like or the same reference numbers denote like or the same structural elements in the descriptions below in view of those shown in FIGS. 1A and 1B. Thus, duplicate descriptions of like or the same structure elements may be omitted herebelow.

In operation S10, a plurality of 3DSFET structures are provided on a single substrate, each 3DSFET structure including a lower channel structure and an upper channel structure on which a high-k dielectric layer is formed. Operation S10 is further described herebelow in reference to FIG. 4A.

Referring to FIG. 4A, an intermediate 3DSFET device 10' including a $1^{st}$ 3DSFET structure 10A', a $2^{nd}$ 3DSFET structure 10B' and a $3^{rd}$ 3DSFET structure 10C' may be provided on the substrate 105. Each of the $1^{st}$ to $3^{rd}$ 3DSFET structures 10A', 10B' and 10C' may include a lower FET structure LT' and an upper FET structure UT'

The intermediate 3DSFET device 10' may be in a state in which a plurality of sacrificial layers and a dummy gate structure surrounding the channel layers 110 and 120 have been removed. The dummy gate structure including polysilicon and the sacrificial layers including silicon germanium may have been used to form other structural elements such as the source/drain regions 113A, 113B, 123A and 123B, and the channel layers 110 and 120, and removed to provide a space for forming the gate structures 115 and 125 for each of the 3DSFET structures 10A', 10B' and 10C'. That is, in some examples, the processes described herein may begin after a dummy-gate removal phase of an overall transistor manufacturing process.

Thus, each of the 3DSFET structures 10A', 10B' and 10C' may include the lower channel layers 110 and the upper channel layers 120 in the space provided by the removal of the dummy gate structure and the sacrificial layers. The lower channel layers 110 and the upper channel layers 120 may be isolated from each other by the channel isolation layer 107.

On each of the channel layers 110 and 120 may be formed a gate dielectric layer including an interfacial layer and a high-k dielectric layer, although not shown in the drawings. The interfacial layer may include a material such as silicon oxide (e.g., $SiO_2$) not being limited thereto, and the high-k dielectric layer may include a material such as hafnium oxide (e.g., HfO) not being limited thereto.

In operation S20, an additional high-k dielectric layer is formed on a lower channel structure of a selected 3DSFET structure, which is subsequently subject to drive-in annealing so that a material forming the additional high-k dielectric layer is diffused into the lower channel structure of the selected 3DSFET structure. Operation S20 is further described herebelow in reference to FIGS. 4B-4E.

Referring to FIG. 4B, an high-k dielectric layer 131 may be deposited on the intermediate 3DSFET device 10' including the channel layers 110 and 120 provided in a previous step. The high-k dielectric layer 131 may also be deposited on a top surface of the substrate 105 and the side surface of the gate-cut structure 116. The high-k dielectric layer 131 may be an additional high-k dielectric layer because a gate structure including a high-k dielectric layer may have already been formed on the channel layers 110 and 120 that was provided in the previous step, as described earlier. The high-k dielectric layer 131 may include a material such as aluminum oxide (e.g., AlO, $Al_2O_3$, etc.) or lanthanum oxide (e.g., LaO, $La_2O_3$, etc.), not being limited thereto, which is different from the material, such as hafnium oxide, of the high-k dielectric layer formed on the channel layers 110 and 120 provided in the previous step. On the high-k dielectric layer 131 may be formed a protection layer 132 including a material such as titanium nitride (e.g., TiN). Thus, the channel layers 110 and 120 of each of the 3DSFET structures 10A', 10B' and 10C' may be surrounded by the high-k dielectric layer 131, which is an additional high-k dielectric layer, and the protection layer 132 thereon.

As will be described later, the high-k dielectric layer 131 may be formed on the channel layers 110 and 120 so that a material forming the high-k dielectric layer 131 can be diffused into selected channel layers that will be subject to drive-in annealing in a later step of manufacturing the 3DSFET device 10. When the material such as aluminum or lanthanum is diffused into a channel layer including, for example, silicon, and a work-function layer and a gate electrode are formed on this channel layer, the channel layer may be able to flow a current at a lower gate threshold voltage.

The protection layer 132 may be formed on the high-k dielectric layer 131 to protect the high-k dielectric layer 131 from a subsequent etching operation until the material of the high-k dielectric layer 131 is diffused into the lower channel layers 110 of a selected 3DSFET structure through the drive-in annealing in a later step.

The formation of the high-k dielectric layer 131 and the protection layer 132 on the channel layers 110 and 120 may be performed through, for example, atomic layer deposition (ALD), not being limited thereto.

Referring to FIG. 4C, a lower barrier structure 141 may be formed on the intermediate 3DSFET device 10' obtained in the previous step, up to a vertical level of approximately the channel isolation layer 107, in order to protect the lower channel layers 110 with the high-k dielectric layer 131 and the protection layer 132 thereon in each of the 3DSFET structures 10A', 10B' and 10C'. The high-k dielectric layer 131 and the protection layer 132 on the upper channel layers 120 of each of the 3DSFET structures 10A', 10B' and 10C' are then removed while the same layers 131, 132 and 120 on the lower channel layers 110 remain in the lower barrier structure 141.

The lower barrier structure 141 may be formed of a spin-on-hardmask (SOH) material such as silicon oxide (e.g., $SiO_2$), not being limited thereto, having etch selectivity against aluminum oxide or lanthanum oxide of the high-k dielectric layer 131 and titanium nitride of the protection layer 132. Alternatively, a polymer-based material for bottom anti-reflective coating (BARC) may form the lower barrier structure 141 to provide etching selectivity against the high-k dielectric layer 131 and the protection layer 132.

In the present step, the formation of the lower barrier structure 141 may be performed by physical vapor deposition (PVD), chemical vapor deposition (CVD), plasma-enhanced VD (PEVD), atomic layer deposition (ALD), and/or plasma-enhanced ALD (PEALD), not being limited thereto, and the removal of the high-k dielectric layer 131 and the protection layer 132 may be performed by dry etching or wet etching using an etchant such as phosphoric acid, not being limited thereto.

Referring to FIG. 4D, the high-k dielectric layer 131 and the protection layer 132 on the lower channel layers 110 of the 3DSFET structures 10B' and 10C' along with the lower barrier structure 141 thereon may be removed, except those on the lower channel layers 110 of the 3DSFET structure 10A', from the intermediate 3DSFET device 10' obtained in the previous step.

For the removal operation in this step, a hardmask layer including an SOH material such as silicon nitride ($Si_3N_4$) or a polymer-based BARC material may be formed on the 3DSFET structure 10A' obtained in the previous step. This masking operation is performed to protect the high-k dielectric layer 131 and the protection layer 132 remaining on the lower channel layers 110 of the 3DSFET structure 10A' with the lower barrier structure 141 thereon while the same layers 131, 132 and structure 141 on the lower channel layers 110 of the 3DSFET structures 10B and 10C are removed through, for example, dry etching or wet etching using an etchant such as hydrofluoric acid, not being limited thereto.

After removing the high-k dielectric layer 131 and the protection layer 132 along with the lower barrier structure 141 thereon from the lower channel layers 110 of the 3DSFET structures 10B and 10C, the hardmask layer including the SOH material or the BARC material on the 3DSFET structure 10A' may be stripped or etched away exposing the lower FET structure LT' in which the lower channel layers 110 of the 3DSFET structure 10A' are surrounded by the high-k dielectric layer 131 and the protection layer 132 with the lower barrier structure 141 thereon.

The lower channel layers 110 of the 3DSFET structure 10A' with the high-k dielectric layer 131 and the protection layer 132 with the lower barrier structure 141 thereon may be subject to a high-temperature drive-in annealing operation so that a high-k dielectric component of the high-k dielectric layer 131, for example, aluminum or lanthanum, can be diffused into the lower channel layers 110 of the 3DSFET structure 10A'. Thus, the lower gate structure 115 to be formed on the lower channel layers 110 of the 3DSFET structure 10A' may have a lower gate threshold voltage compared to the lower gate structures 115 to be formed on the lower channel layers 110 of the 3DSFET structures 10B' and 10C'.

Referring to FIG. 4E, the high-k dielectric layer 131 and the protection layer 132 with the lower barrier structure 141 remaining on the lower channel layers 110 of the 3DSFET structure 10A' may be removed after the drive-in annealing operation performed in the previous step, thereby releasing the channel layers 110 and 120 of the 3DSFET structures 10A', 10B' and 10C', among which the lower channel layers 110 of only the 3DSFET structure 10A' may include the high-k dielectric component diffused therein.

As described above, the high-k dielectric component diffused into the lower channel layers 110 of the 3DSFET structure 10A' may be, for example, aluminum or lanthanum.

The high-k dielectric layer 131 and the protection layer 132 with the lower barrier structure 141 remaining on the lower channel layers 110 of the 3DSFET structure 10A' may be removed through, for example, dry etching or wet etching using an etchant such as hydrofluoric acid, not being limited thereto. The high-k dielectric layer 131 may be etched here based on etch selectivity of the material thereof, e.g., aluminum oxide or lanthanum oxide, against the material, e.g., hafnium oxide, included in the original high-k dielectric layer formed on the channel layers 110 and 120 in the step of FIG. 4A. Thus, after removal of the high-k dielectric layer 131 and the protection layer 132 with the lower barrier structure 141 thereon, the original high-k dielectric layer may still remain on the lower channel layers 110 as well as the upper channel layers 120.

In operation S30, another additional high-k dielectric layer is formed on an upper channel structure of a selected 3DSFET structure, which is subsequently subject to drive-in annealing so that a high-k material forming the other additional high-k dielectric layer is diffused into the upper channel structure of the selected 3DSFET structure. Operation S30 is further described herebelow in reference to FIGS. 4F-4I.

Referring to FIG. 4F, another lower barrier structure 142 may be deposited on the intermediate 3DSFET device 10' obtained in the previous step, up to a level of approximately the channel isolation structure 107, thus surrounding the lower channel layers 110 of each of the 3DSFET structures 10A', 10B' and 10C' while the upper channel layers 120 thereof are exposed. The lower barrier structure 142 may be formed of, for example, polysilicon.

Referring to FIG. 4G, another high-k dielectric layer 151 including a material such as aluminum oxide or lanthanum oxide and a protection layer 152 including a material such as titanium nitride may be formed on the upper channel layers 120 of the 3DSFET structure 10C' enclosed by a hardmask structure 143.

In order to form the high-k dielectric layer 151 and the protection layer 152 on the upper channel layers 120 of the 3DSFET structure 10C', the high-k dielectric layer 151 and the protection layer 152 may be deposited on the upper channel layers 120 of all of the 3DSFET structures 10A', 10B' and 10C' through, for example, atomic layer deposition. Then, the hardmask structure 143 including an SOH material or a BARC material may be deposited only on selected channel layers, that is, the upper channel layers 120 of the 3DSFET structure 10C', and then, the high-k dielectric layer 151 and the protection layer 152 of the upper channel layers 120 of the other two 3DSFET structures 10A' and 10B' may be removed based on the hardmask structure 143.

The high-k dielectric layer 151 may be formed of aluminum oxide or lanthanum oxide, for example, similar to the material forming the high-k dielectric layer 131 described above in reference to FIG. 4B, and the protection layer 152 may also be formed of titanium nitride, for example, similar to the material forming the protection layer 132 also described in reference to FIG. 4B.

The hardmask structure 143 may be formed of an SOH material such as silicon oxide or a polymer-based BARC material similar to the material forming the lower barrier structure 141 described in reference to FIG. 4C so that the hardmask structure 143 may have etch selectivity against aluminum oxide or lanthanum oxide of the high-k dielectric layer 151 and titanium nitride of the protection layer 152.

The upper channel layers 120 of the 3DSFET structure 10C' with the high-k dielectric layer 151 and the protection layer 152 with the hardmask structure 143 thereon may be subject to a high-temperature drive-in annealing operation so that the high-k dielectric component of the high-k dielectric layer 151, for example, lanthanum, can be diffused into the upper channel layers 120 of the 3DSFET structure 10C'. Thus, the upper gate structure 125 to be formed on the upper channel layers 120 of the 3DSFET structure 10C' may have a lower gate threshold voltage compared to the upper gate structures 125 to be formed on the upper channel layers 120 of the 3DSFET structures 10B' and 10C'.

Referring to FIG. 4H, the high-k dielectric layer 151 and the protection layer 152 with the hardmask structure 143 remaining on the upper channel layers 120 of the 3DSFET structure 10C' may be removed after the drive-in annealing operation performed in the previous step, thereby releasing the upper channel layers 120 of the 3DSFET structures 10A', 10B' and 10C', among which the upper channel layers 120 of the 3DSFET structure 10C' may include the high-k dielectric component diffused therein.

As described above, the high-k dielectric component diffused into the upper channel layers 120 of the 3DSFET structure 10C' may be, for example, aluminum or lanthanum.

The high-k dielectric layer 151 and the protection layer 152 with the hardmask layer 143 remaining on the upper channel layers 120 of the 3DSFET structure 10C' may be removed through, for example, dry etching or wet etching. Similar to the high-k dielectric layer 131 in the step of FIG. 4D, the high-k dielectric layer 151 may also be etched based on etch selectivity of the material thereof, e.g., aluminum oxide or lanthanum oxide, against the material, e.g., hafnium oxide, included in the original high-k dielectric layer formed on the channel layers 110 and 120 in the step of FIG. 4A. Thus, after removal of the high-k dielectric layer 151 and the protection layer 152 with the hardmask structure 143 thereon, the original high-k dielectric layer may still remain on the upper channel layers 120 as well as the lower channel layers 110.

Referring to FIG. 4I, the lower barrier structure 142 surrounding the lower channel layers 110 of each of the 3DSFET structures 10A', 10B' and 10C' may be removed through, for example, plasma dry etching using an etchant such as chlorine or hydrogen chloride, not being limited thereto, thereby releasing all channel layers 110 and 120 of the 3DSFET structures 10A', 10B' and 10C'.

In operation S40, a $1^{st}$ work-function layer is formed on the lower channel structures and the upper channel structures of all 3DSFET structures, and a $2^{nd}$ work-function layer is formed on the lower channel structure and the upper channel structure of a selected 3DSFET structure. Operation S40 is further described herebelow in reference to FIGS. 4J-4L.

Referring to FIG. 4J, a $1^{st}$ work-function layer 115W' may be formed on all channel layers 110 and 120 of the 3DSFET structures 10A', 10B' and 10C' through, for example, atomic layer deposition, not being limited thereto.

As will be described later, the $1^{st}$ work-function layer 115W' is to become the inner lower work-function layer 115W' of the lower gate structure 115 of the lower FET LT in the 3DSFET 10C when the intermediate 3DSFET device 10' is completed as the 3DSFET device 10 shown in FIGS. 1A and 1B. The $1^{st}$ work-function layer 115W' may be formed of titanium (Ti), aluminum (Al), tantalum (Ta), palladium (Pa), platinum (Pt) or their compound, not being limited thereto.

Referring to FIG. 4K, a hardmask structure 144 may be formed to enclose the channel layers 110 and 120 of the 3DSFET structure 10C' on which the $1^{st}$ work-function layer 115W' is formed, and the $1^{st}$ work-function layer 115W' formed on the channel layers 110 and 120 of the 3DSFET structures 10A' and 10B' may be removed based on the hardmask structure 144.

The $1^{st}$ work-function layer 115W' on the channel layers 110 and 120 of the 3DSFET structures 10A' and 10B' may be removed through, for example, dry etching or wet etching using an etchant such as hydrofluoric acid or a mixture of hydrochloric acid, not being limited thereto, while the $1^{st}$ work-function layer 115W' on the channel layers 110 and 120 of the 3DSFET structure 10C' is enclosed by the hardmask structure 144. The hardmask structure 144 may be formed of an SOH material such as silicon oxide, silicon nitride, silicon carbide, or a polymer-based BARC material, not being limited thereto.

Referring to FIG. 4L, the hardmask structure 144 may be removed through, for example, dry etching or wet etching, to expose the channel layers 110 and 120 of the 3DSFET structure 10C' with the $1^{st}$ work-function layer 115W' thereon, and a $2^{nd}$ work-function layer 115W may be formed on all channel layers 110 and 120 of the 3DSFET structures 10A', 10B' and 10C' through, for example, atomic layer deposition, not being limited thereto.

At the channel layers 110 and 120 of the 3DSFET structure 10C', the $2^{nd}$ work-function layer 115W may be deposited on the $1^{st}$ work-function layer 115W'. Thus, the channel layers 110 and 120 of the 3DSFET structure 10C' may have a thicker work-function layer thereon than the channel layers 110 and 120 of the 3DSFET structures 10A' and 10B'. As the $2^{nd}$work-function layer 115W is deposited on the $1^{st}$ work-function layer 115W', an interface may be formed between the two work-function layers 115W' and 115W.

The $2^{nd}$ work-function layer 115W is to become the lower work-function layer 115W of the lower gate structure 115 of the lower FET LT in each of the 3DSFETs 10A, 10B and 10C when the intermediate 3DSFET device 10' is completed as the 3DSFET device 10 shown in FIGS. 1A and 1B. The $2^{nd}$ work-function layer 115W may be formed of the same or similar material forming the $1^{st}$ work-function layer 115W'

In operation S50, a lower gate electrode is formed on the $2^{nd}$ work-function layer on the lower channel structure of each 3DSFET structure to complete lower gate structures of the 3DSFET structures. Operation S50 is further described here below in reference to FIG. 4M.

Referring to FIG. 4M, the lower gate electrode 115G may be formed up to a vertical level of approximately the channel isolation structure 107, so as to surround the $2^{nd}$ work-function layer 115W on the lower channel layers 110 of each of the 3DSFET structures 10A', 10B' and 10C'.

For this formation of the lower gate electrode 115G on the lower channel layers 110, a gate metal such as tungsten (W), aluminum (Al), copper (Cu) or cobalt (Co), not being limited thereto, may be deposited on the $2^{nd}$ work-function layer 115W formed on all channel layers 110 and 120 of the 3DSFET structures 10A', 10B' and 10C', and then, the deposited gate material may be removed from the $2^{nd}$ work-function layer 115W on the upper channel layers 120 of the 3DSFET structures 10A', 10B' and 10C'.

The deposition of the gate material in this step may be performed through, for example, physical vapor deposition (PVD), chemical vapor deposition (CVD), plasma-enhanced VD (PEVD), atomic layer deposition (ALD), and/or plasma-enhanced ALD (PEALD), not being limited thereto, and the removal of the deposited gate material may be performed by dry etching such as reactive ion etching, not being limited thereto.

Thus, the lower gate structures 115 shown in FIGS. 1A and 1B may be completed for the 3DSFETs 10A, 10B and 10C.

In operation S60, a barrier layer formed of a dielectric material including tantalum such as tantalum nitride may be formed on the lower gate electrode of each 3DSFET structure, and the $1^{st}$ work-function layer and the $2^{nd}$ work-function layers on the upper channel structure of each 3DSFET structure is removed based on the barrier layer. Operation S60 is further described herebelow in reference to FIGS. 4N-4O.

Referring to FIG. 4N, a barrier layer 145 may be formed on the lower gate electrode 115G to protect the lower gate electrode 115G from a subsequent etching operation to remove the $1^{st}$ work-function layer 115W' and the $2^{nd}$ work-function layer 115W formed on the upper channel layers 120 of the 3DSFET structures 10A', 10B' and 10C'. Further, a hardmask structure 146 including an SOH material or a BARC material may be formed on the barrier layer 145.

The barrier layer 145 may include a dielectric material including tantalum, according to an embodiment. For example, the barrier layer 145 may be formed of tantalum nitride (e.g., TaN) or tantalum carbide (e.g., TaC). The SOH material for the hardmask structure 146 may include silicon oxide, silicon nitride or their compound, not being limited thereto, and the BARC material for the hardmask structure 146 may be a polymer-based material, not being limited thereto.

FIG. 4N shows that the barrier layer 145 and the hardmask structure 146 are formed at a mid-level between the lowermost upper channel layer among the upper channel layers 120 and the uppermost channel layer among the lower channel layers 110. This formation of the barrier layer 145 and the hardmask structure 146 may be performed by depositing the barrier layer 145 on the upper FET structure UT' of each of the 3DSFET structures 10A', 10B' and 10C' including the side surfaces of the gate-cut structure 116 and the channel isolation layer 107 above the lower gate structure 115, and removing the barrier layer 145 deposited on the upper channel layers 120 based on the hardmask structure 146 so that the barrier layer 145 and the hardmask structure 146 thereon remain only on a top surface of the lower gate electrode 115G of each of the 3DSFET structures 10A', 10B' and 10C' and a side surface of the gate-cut structure 116 at the mid-level between the lowermost upper channel layer and the upper most channel layer in each of the 3DSFET structures 10A', 10B' and 10C'.

The barrier layer 145 may be deposited on the upper FET structure UT' through, for example, atomic layer deposition (ALD). When the barrier layer 145 is formed of tantalum nitride, the ALD may be performed at a deposition thickness of about 1 nm. In contrast, when the barrier layer 145 is formed of amorphous silicon (a-Si) according to a related art, the ALD may be performed at a deposition thickness of about 4 nm, which may result in formation of a barrier layer having a lower material density. For example, when amorphous silicon is deposited as the barrier layer 145 on the lower gate electrode 115G to protect the lower gate electrode 115G from a subsequent etching operation to remove the work-function layers 115W' and 115W including, for example, titanium nitride, on the upper channel layers 120, the barrier layer 145 may have a seam structure including a void therein as described in reference to FIG. 1B, which may allow intrusion of an etchant applied to remove the work-function layers 115W' and 115W from the upper channel layers 120. When this etchant intrudes the barrier layer 145 through the void, the lower gate electrode 115G may be attacked or etched by the etchant, which may deteriorate the performance of the lower gate structure 115 of each of the 3DSFET structures 10A', 10B' and 10C'.

However, the barrier layer 145 including tantalum nitride according to the present embodiment may prevent formation of the void therein, thereby improving the barrier function against the etchant to remove the work-function layers 115W' and 115W from the upper channel layers 120.

Further, the barrier layer 145 formed of tantalum nitride may occupy a smaller area on the lower gate electrode 115G while a barrier layer formed of amorphous silicon occupies a greater area at least because of the greater deposition thickness. Thus, the barrier layer 145 formed of tantalum nitride may provide a reduced gate resistance when the intermediate 3DSFET device 10' is completed as the 3DSFET device 10.

As described earlier, the barrier layer 145 may include a material or compound different from tantalum nitride, according to an embodiment. For example, tantalum carbide may replace the tantalum nitride included in the barrier layer 145 due to similarity of material characteristics including the material density.

Referring to FIG. 4O, the work-function layers 115W' and 115W may be removed from the upper channel layers 120 of the 3DSFET structures 10A', 10B' and 10C' based on the barrier layer 145 with the hardmask structure 146 thereon. After removal of the work-function layers 115W' and 115W, the hardmask structure 146 on the barrier layer 145 may also be removed.

It is understood here that the work-function layers 115W' and 115W are removed from the upper channel layers 120 because these work-function layers 115W' and 115W are to be part of only the lower gate structures 115 of the 3DSFET structures 10A', 10B' and 10C' when the intermediate 3DSFET device 10' is completed as the 3DSFET device 10 shown in FIGS. 1A and 1B.

The work-function layers 115W' and 115W on the upper channel layers 120 may be removed through, for example, wet etching using an etchant such as such as hydrofluoric acid or a mixture of hydrochloric acid, at least based on etch selectivity against the barrier layer 145. For example, when the work-function layers 115W' and 115W are formed of titanium, the work-function layers 115W' and 115W on the upper channel layers 120 may be etched away against the barrier layer 145 including a dielectric material such as tantalum nitride or tantalum carbide.

The hardmask structure 146 may also be removed in this step through, for example, dry etching such as reactive ion etching. As the hardmask structure 146 on the barrier layer 145 on the top surface of the lower gate electrode 115G is removed, the barrier layer 145 may remain in a U-shape or a similar shape at each side of the channel isolation layer 107 in each of the 3DSFET structures 10A', 10B' and 10C'.

In operation S70, a $3^{rd}$ work-function layer is formed on the upper channel structures of all 3DSFET structures, and a $4^{th}$ work-function layer is formed on the upper channel structure of a selected 3DSFET structure. Operation S70 is further described herebelow in reference to FIGS. 4P-4Q.

Referring to FIG. 4P, a $3^{rd}$ work-function layer 125W' may be formed on the upper channel layers 120 of the 3DSFET structure 10A' with a hardmask structure 147 thereon.

The $3^{rd}$ work-function layer 125W' is to become the inner upper lower work-function layer 125W' of the upper gate structure 125 of the upper FET UT in the 3DSFET 10A when the intermediate 3DSFET device 10' is completed as the 3DSFET device 10 shown in FIGS. 1A and 1B. The material forming the $3^{rd}$ work-function layer 125W' may be the same as or different from that of the $1^{st}$ work-function layer 115W' and the $2^{nd}$ work-function layer 115W.

The formation of the $3^{rd}$ work-function layer 125W' on the upper channel layers 120 of only the 3DSFET structure 10A' may be performed by depositing the $3^{rd}$ work-function layer 125W' on the upper channel layers 120 of all of the 3DSFET structures 10A', 10B' and 10C', forming the hardmask structure 147 only for 3DSFET 10A', and removing the $3^{rd}$ work-function layers 125W' from the upper channel layers 120 of the 3DSFET structures 10B' and 10C' based on the hardmask structure 147.

The deposition of the $3^{rd}$ work-function layer 125W' on the upper channel layers 120 of the 3DSFET structures 10A', 10B' and 10C' may be performed through, for example, atomic layer deposition, not being limited thereto. The removal of the $3^{rd}$ work-function layer 125W' from the upper channel layers 120 of the 3DSFET structures 10B' and 10C' may be performed through, for example, dry etching or wet etching using an etchant such as hydrofluoric acid or a mixture of hydrochloric acid, not being limited thereto, while the $3^{rd}$ work-function layer 125W' on the upper channel layers 120 of the 3DSFET structure 10A' is enclosed by the hardmask structure 147. The hardmask structure 147 may be formed of an SOH material such as silicon oxide, silicon nitride, silicon carbide, or a polymer-based BARC material, not being limited thereto.

Referring to FIG. 4Q, the hardmask structure 147 may be removed through, for example, dry etching or wet etching, to expose the upper channel layers 120 of the 3DSFET structure 10A' with the $3^{rd}$ work-function layer 125W' thereon, and a $4^{th}$ work-function layer 125W may be formed on all upper channel layers 120 of the 3DSFET structures 10A', 10B' and 10C' through, for example, atomic layer deposition, not being limited thereto.

At the upper channel layers 120 of the 3DSFET structure 10A', the $4^{th}$ work-function layer 125W may be deposited on the $3^{rd}$ work-function layer 125W'. Thus, the upper channel layers 120 of the 3DSFET structure 10A' may have a thicker work-function layer thereon than the upper channel layers 120 of the 3DSFET structures 10B' and 10C'. As the $4^{th}$ work-function layer 125W is deposited on the $3^{rd}$ work-function layer 125W', an interface may be formed between the two work-function layers 125W' and 125W.

The $4^{th}$ work-function layer 125W is to become the upper work-function layer 125W of the upper gate structure 125 of the upper FET UT in each of the 3DSFETs 10A, 10B and 10C when the intermediate 3DSFET device 10' is completed as the 3DSFET device 10 shown in FIGS. 1A and 1B. The $4^{th}$ work-function layer 125W may be formed of the same or similar material forming the $3^{rd}$ work-function layer 125W'.

In operation S80, an upper gate electrode is formed on the $4^{th}$ work-function layer on the upper channel structure of each 3DSFET structure to complete upper gate structures of the 3DSFET structures, thereby completing a 3DSFET device. Operation S80 is further described herebelow in reference to FIG. 4R.

Referring to FIG. 4R, the upper gate electrode 125G may be formed to surround the $4^{th}$ work-function layer 125W on the upper channel layers 120 of each of the 3DSFET structures 10A', 10B' and 10C'.

For the formation of the upper gate electrode 125G on the upper channel layers 120, a gate metal such as tungsten (W), aluminum (Al), copper (Cu) or cobalt (Co), not being limited thereto, may be deposited on the $4^{th}$ work-function layer 125W of all upper channel layers 120 of the 3DSFET structures 10A', 10B' and 10C'.

The deposition of the gate material in this step may be performed through, for example, physical vapor deposition (PVD), chemical vapor deposition (CVD), plasma-enhanced VD (PEVD), atomic layer deposition (ALD), and/or plasma-enhanced ALD (PEALD), not being limited thereto, followed by chemical-mechanical planarization.

Thus, the upper gate structures 125 shown in FIGS. 1A and 1B may be completed for the 3DSFETs 10A, 10B and 10C.

Figure 5:
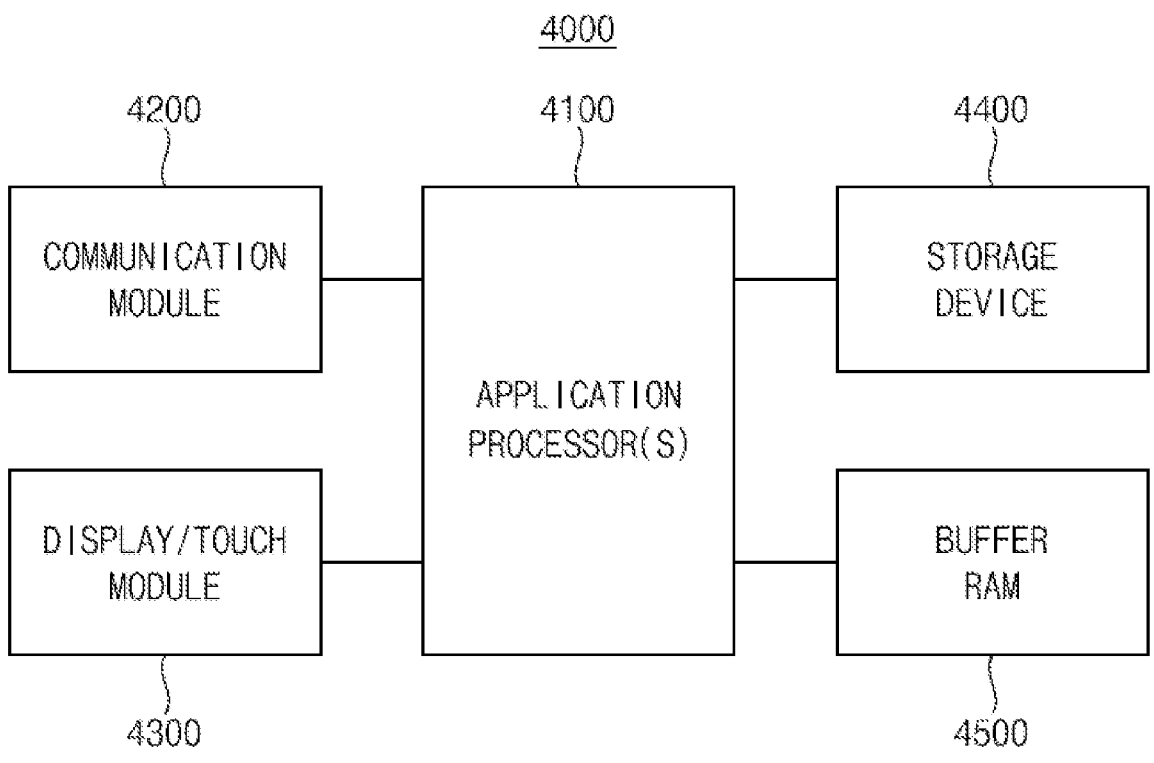
FIG. 5 is a schematic block diagram illustrating an electronic device including the 3DSFET device shown in FIGS. 1A and 1, according to an embodiment.

FIG. 5 is a schematic block diagram illustrating an electronic device including the 3DSFET device 10 shown in FIGS. 1A and 1i, according to an embodiment.

Referring to FIG. 5, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 5, the electronic device 4000 may further include at least one sensor such as an image sensor.

At least one component in the electronic device 4000 may include the 3DSFET device 10 shown in FIGS. 1A and 1B.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A three-dimensionally-stacked field-effect transistor (3DSFET) device comprising a plurality of 3DSFETs on a single substrate, wherein each of the 3DSFET comprises:
   a $1^{st}$ channel structure surrounded by a $1^{st}$ gate structure; and
   a $2^{nd}$ channel structure surrounded by a $2^{nd}$ gate structure, the $2^{nd}$ channel structure provided on the $1^{st}$ channel structure,
   wherein the $1^{st}$ channel structure is isolated from the $2^{nd}$ channel structure by a channel isolation layer,
   wherein, in at least one of the 3DSFETs, the $1^{st}$ gate structure is isolated from the $2^{nd}$ gate structure through a barrier layer comprising a dielectric material comprising tantalum, and
   wherein the $2^{nd}$ gate structure extends toward the $1^{st}$ gate structure beyond a top surface of the channel isolation layer.

2. The 3DSFET device of claim 1, wherein the barrier layer extends conformally on the $1^{st}$ gate structure and on a side surface of the channel isolation layer, and wherein the dielectric material comprises tantalum nitride.

3. The 3DSFET device of claim 1, wherein each of the $1^{st}$ gate structure and the $2^{nd}$ gate structure comprises a high-k dielectric layer, a work-function layer, and a gate electrode, and
   wherein, in at least one of the 3DSFETs, at least one of the $1^{st}$ channel structure and the $2^{nd}$ channel structure comprises a high-k dielectric material diffused therein.

4. The 3DSFET device of claim 3, wherein the diffused high-k dielectric material is different from a material forming the high-k dielectric layer.

5. The 3DSFET device of claim 4, wherein the diffused high-k dielectric material comprises aluminum or lanthanum.

6. The 3DSFET device of claim 4, wherein, in at least one of the 3DSFETs, at least one of the $1^{st}$ gate structure and the $2^{nd}$ gate structure comprises another work-function layer on the work-function layer.

7. The 3DSFET device of claim 4, wherein the work-function layer of at least one of the $1^{st}$ gate structure and the $2^{nd}$ gate structure of at least one of the 3DSFET structures is thicker than the work-function layer of at least one of the $1^{st}$ gate structure and the $2^{nd}$ gate structure of another at least one of the 3DSFET structures.

8. The 3DSFET device of claim 3, wherein, in at least one of the 3DSFET structures, at least one of the $1^{st}$ gate structure and the $2^{nd}$ gate structure comprises another work-function layer on the work-function layer.

9. The 3DSFET device of claim 3, wherein the work-function layer of at least one of the $1^{st}$ gate structure and the $2^{nd}$ gate structure of at least one of the 3DSFET structures is thicker than the work-function layer of at least one of the $1^{st}$ gate structure and the $2^{nd}$ gate structure of another at least one of the 3DSFET structures.

10. The 3DSFET device of claim 1, wherein each of the $1^{st}$ gate structure and the $2^{nd}$ gate structure comprises a high-k dielectric layer, a work-function layer, and a gate electrode, and
   wherein, in at least one of the 3DSFET structures, at least one of the $1^{st}$ gate structure and the $2^{nd}$ gate structure comprises another work-function layer on the work-function layer.

11. The 3DSFET device of claim 1, wherein each of the $1^{st}$ gate structure and the $2^{nd}$ gate structure comprises a high-k dielectric layer, a work-function layer, and a gate electrode, and
   wherein the work-function layer of at least one of the $1^{st}$ gate structure and the $2^{nd}$ gate structure of at least one of the 3DSFET structures is thicker than the work-function layer of at least one of the $1^{st}$ gate structure and the $2^{nd}$ gate structure of another at least one of the 3DSFET structures.

12. A three-dimensionally-stacked field-effect transistor (3DSFET) device comprising a plurality of 3DSFETs on a single substrate, wherein each of the 3DSFET comprises:
   a $1^{st}$ channel structure surrounded by a $1^{st}$ gate structure; and
   a $2^{nd}$ channel structure surrounded by a $2^{nd}$ gate structure, the $2^{nd}$ channel structure provided on the $1^{st}$ channel structure,
   wherein the $1^{st}$ channel structure is isolated from the $2^{nd}$ channel structure by a channel isolation layer,
   wherein each of the $1^{st}$ gate structure and the $2^{nd}$ gate structure comprises a high-k dielectric layer, a work-function layer, and a gate electrode,
   wherein, in at least one of the 3DSFETs, the $1^{st}$ gate structure is isolated from the $2^{nd}$ gate structure through a barrier layer comprising a dielectric material having etch selectivity against a material included in the work-function layer of $1^{st}$ gate structure, wherein the $2^{nd}$ gate structure extends toward the $1^{st}$ gate structure beyond a top surface of the channel isolation layer.

13. The 3DSFET device of claim 12, wherein the barrier layer extends conformally on the $1^{st}$ gate structure and on a side surface of the channel isolation layer, and wherein the dielectric material included in the barrier layer comprises tantalum.

14. The 3DSFET device of claim 13, wherein the dielectric material comprises tantalum nitride, and the material included in the work-function layer of the $1^{st}$ gate structure comprises titanium.

15. The 3DSFET device of claim 12, wherein, in at least one of the 3DSFETs, at least one of the $1^{st}$ channel structure and the $2^{nd}$ channel structure comprises a high-k dielectric material diffused therein, and wherein the diffused high-k dielectric material is different from a material forming the high-k dielectric layer.

16. The 3DSFET device of claim 12, wherein the work-function layer of at least one of the $1^{st}$ gate structure and the $2^{nd}$ gate structure of at least one of the 3DSFET structures is thicker than the work-function layer of at least one of the $1^{st}$ gate structure and the $2^{nd}$ gate structure of another at least one of the 3DSFET structures.

17. A method of manufacturing a three-dimensionally-stacked field-effect transistor (3DSFET) device, the method comprising:

providing at least one 3DSFET structure comprising a lower channel structure and an upper channel structure on a substrate, and a channel isolation layer between the lower channel structure and the upper channel structure;

forming a lower gate structure on the lower channel structure;

forming a barrier layer extending on the lower gate structure and on a side surface of the channel isolation layer, the barrier layer comprising a dielectric material comprising tantalum; and forming an upper gate structure on the upper channel structure.

18. The method of claim 17, wherein the at least one 3DSFET comprises a plurality of 3DSFET structures, each comprising the lower channel structure surrounded by a high-k dielectric layer and the upper channel structure surrounded by the high-k dielectric layer, and wherein the method further comprises:

forming a $1^{st}$ additional high-k dielectric layer on the lower channel structure of a $1^{st}$ selected 3DSFET among the 3DSFET structures, and annealing the lower channel structure of the $1^{st}$ selected 3DSFET such that a material of the $1^{st}$ additional high-k dielectric layer is diffused into the lower channel structure of the $1^{st}$ selected 3DSFET; and forming a $2^{nd}$ additional high-k dielectric layer on the upper channel structure of a $2^{nd}$ selected 3DSFET among the 3DSFET structures, and annealing the upper channel structure of the $2^{nd}$ selected 3DSFET such that a material of the $2^{nd}$ additional high-k dielectric layer is diffused into the upper channel structure of the $2^{nd}$ selected 3DSFET, wherein the materials of the $1^{st}$ and $2^{nd}$ additional high-k dielectric layers are different from a material forming the high-k dielectric layer.

19. The method of claim 17, wherein the at least one 3DSFET comprises a plurality of 3DSFET structures, each comprising the lower channel structure and the upper channel structure, and wherein the forming the lower gate structure comprises:

forming a $1^{st}$ work-function layer on lower channel structures and upper channel structures of the 3DSFET structures, and forming a $2^{nd}$ work-function layer on a lower channel structure of a $1^{st}$ selected 3DSFET; and forming a lower gate electrode on the $2^{nd}$ work-function layer on the lower channel structure of each of the 3DSFET structures.

20. The method of claim 19, wherein the forming the upper gate structure comprises:

removing the $1^{st}$ work-function layer and the $2^{nd}$ work-function layers on the upper channel structures of the 3DSFET structures; and forming a $3^{rd}$ work-function layer on the upper channel structures of the 3DSFET structures, and forming a $4^{th}$ work-function layer on an upper channel structure of a $2^{nd}$ selected 3DSFET, wherein the upper gate structure extends toward the lower gate structure beyond a top surface of the channel isolation layer.

* * * * *